United States Patent [19]

Stengl et al.

[11] Patent Number: 4,967,088
[45] Date of Patent: Oct. 30, 1990

[54] METHOD AND APPARATUS FOR IMAGE ALIGNMENT IN ION LITHOGRAPHY

[75] Inventors: Gerhard Stengl, Wernberg; Hans Loschner; Ernst Hammell, both of Vienna, all of Austria; Hilton F. Glavish, Salem, Mass.

[73] Assignees: Oesterreichische Investitionskredit Aktiengesellschaft; IMS Ionen Mikrofabrikations Systeme Gesellschaft m.b.H., both of Austria

[21] Appl. No.: 201,959

[22] Filed: Jun. 2, 1988

Related U.S. Application Data

[63] Continuation-in-part of Ser. No. 50,978, May 15, 1987, Pat. No. 4,823,011.

[30] Foreign Application Priority Data

Jun. 2, 1987 [AT] Austria ................................. 1404/87

[51] Int. Cl.⁵ ......................................... H01J 37/304
[52] U.S. Cl. ................................. 250/491.1; 250/398; 250/397; 250/492.3
[58] Field of Search ............. 250/491.1, 492.21, 492.2, 250/398, 397

[56] References Cited

U.S. PATENT DOCUMENTS 2,625,734  1/1953  Law ................................... 29/25.13
2,919,381  12/1959  Glaser ................................ 315/31

(List continued on next page.)

FOREIGN PATENT DOCUMENTS

| 0039407 | 3/1981 | European Pat. Off. |
| 0075949 | 9/1982 | European Pat. Off. |
| 52-28239 | 3/1977 | Japan |
| 51-45005 | 4/1982 | Japan |
| 5168052 | 6/1982 | Japan |
| 57-77650 | 11/1983 | Japan |
| 57-90285 | 12/1983 | Japan |
| 58-181535 | 4/1985 | Japan |
| 1597594 | 9/1981 | United Kingdom |
| 1597595 | 9/1981 | United Kingdom |
| 1597596 | 9/1981 | United Kingdom |

OTHER PUBLICATIONS

Anger et al., "Design and Testing of a Corrected Projection Lens System for Electron-Beam Lithography," Springer Verlag, 1980, p. 174.

(List continued on next page.)

Primary Examiner—Jack I. Berman
Attorney, Agent, or Firm—Fish & Richardson

[57] ABSTRACT

In an ion projection lithography system, apparatus and methods for positioning on a substrate or wafer at a target station an image of structures provided on a mask, wherein the mask includes reference marks to provide ion reference beams about the image field, the target station includes marks and the beam of the system is controlled to establish a coincidence of the marks on the mask with the corresponding marks at the target station. The ion projection system shown includes in this optical path an electrostatic multipole, means for rotational adjustment of the image relative to the substrate, and means for correcting the scale of the image. Embodiments are shown in which the marks at the target station are carried on the wafer or on a reference block which is positionally related to the wafer, e.g., by an interferometer. In the case of the reference block, it has an aperture corresponding in size to the mask image to be formed on the substrate so that the marks are disposed outside the optical path used to generate the image on the substrate. Detectors provided for secondary radiation emitted by the marks at the target station as a result of the ion reference beams passing through the marks on the mask produce signals that control the multipole, the means for relative rotational adjustment of the image on the substrate and the means for scale correction. Special masks are provided that enable the reference beams to reach their respective marks at the target station during blanking and unblanking of the mask, permitting operation of the alignment system at both times. The reference beams are shielded from the image beam and are scanned repeatedly over their respective marks at the target station.

49 Claims, 17 Drawing Sheets

U.S. PATENT DOCUMENTS

| | | | |
|---|---|---|---|
| 2,973,433 | 2/1961 | Kramer | 250/19.5 |
| 3,434,894 | 3/1969 | Gale | 148/187 |
| 3,845,312 | 10/1974 | Allison, Jr. | 250/398 |
| 3,928,094 | 12/1975 | Angell | 148/187 |
| 4,085,330 | 4/1978 | Wolfe | 250/492 |
| 4,090,077 | 5/1978 | Anger | 250/311 |
| 4,112,307 | 9/1978 | Foll et al. | 250/510 |
| 4,119,854 | 10/1978 | Tanaka et al. | 250/397 |
| 4,139,773 | 2/1979 | Swanson | 250/423 R |
| 4,169,230 | 9/1979 | Bohlen et al. | 250/492 A |
| 4,362,942 | 12/1982 | Yasuda | 250/398 |
| 4,370,554 | 1/1983 | Bohlen et al. | 250/491.1 |
| 4,457,803 | 7/1984 | Takigawa | 156/626 |
| 4,503,329 | 3/1985 | Yamaguchi et al. | 250/309 |
| 4,514,638 | 4/1985 | Lischke et al. | 250/492.2 |
| 4,536,226 | 8/1985 | Ohtake et al. | 148/12 C |
| 4,554,458 | 11/1985 | Behringer et al. | 250/492.2 |
| 4,578,587 | 3/1986 | Behringer et al. | 250/492.2 |
| 4,591,540 | 5/1986 | Bohlen et al. | 430/22 |
| 4,683,378 | 7/1987 | Shimase et al. | 250/492.2 |
| 4,698,236 | 10/1987 | Kellogg et al. | 427/43.1 |

OTHER PUBLICATIONS

Anger et al., "Lens Design of Electron Pattern Generators," *Int. Conf. on Microlithography* 1977 Paris, p. 179.

"Ion Implantation," V. 8 (1973: ed. Dearnaley), p. 447.

Bassous et al., "High Transmission X-Ray Masks for Lithographic Applications," *IBM Technical Disclosure Bulletin*, vol. 18, No. 12, p. 4210, 1976.

Behringer et al., "Repair Techniques for Silicon Transmission Masks Used for Submicron Lithography," *J. Vacuum Science Technology*, p. 94, Jan./Feb., 1986.

Behringer et al., "Investigation of the Radiation Loads of a Self-Supporting Silicon Mask in an Ion Beam Proximity Printer," *Proceedings from the International Conference on Microlithography*, p. 369, 1981, Lausanne, Switzerland.

Bohlen et al., "High Throughput Submicron Lithography with Electron Beam Proximity Printing," *Solid State Technology*, p. 213, Sep., 1984.

Bohlen et al., "Electron Beam Proximity Printing: Mask Life Investigations," *J. Vac. Sci. Technol.*, 16(6), p. 1834, 1979.

Bohlen et al., "Accuracy of Image Positioning in an Electron Beam Proximity Printer," *J. Vac. Sci. Technol.*, 19(4), 1981, p. 971.

Bohlen et al., "Silicon Supported E. B. Proximity Masks," *Eighth International Conference on Electron and Ion Beam Science and Technology*, Seattle, p. 420, May 1978.

Fischer et al., "Ion Projection Lithography in (In)organic Resist Layers," *Microelectronic Engineering* 5, pp. 193–200, 1986.

Free et al., "Projection Ion Lithography with Aperture Lenses," *J. Vac. Sci. Technol.*, 15(3), p. 1028, 1978.

Frosien et al., "On-Line Alignment for Electron Projection Systems," *Int. Conf. on Microlithography* 1977 Paris, p. 175.

Heritage, "Electron-Projection Microfabrication System," *J. Vac. Sci. Technol.*, vol. 12(6), 1975, p. 1135.

Heuberger et al., "Open Silicon Stencil Masks for Demagnifying Ion Projection," *Microelectronic Engineering* 6, 1987, p. 333.

Koops, "Electron Beam Projection Techniques," *Fine Line Lithography*, ed. R. Neuman, p. 233, North Holland Publishing, New York, 1980.

Lischke et al., "A Study on the Operation Condition for (1:4) Electron Projection Systems," *Eighth International Conference on Electron and Ion Beam Science and Technology*, Seattle, 1978.

Lischke et al., "Investigations about High Performance Electron-Microprojection Systems," *Eighth International Conference on Electron and Ion Beam Science and Technology*, Seattle, 1978.

Lischke et al., "Pattern Fabrication with Electron Projection Systems: Part I: Pattern Generation by 1:1 Shadow Printing," *Int. Conf. on Microlithography* 1977 Paris, p. 163.

Lischke et al., "Pattern Fabrication with Electron Projection Systems: Part II: Resolution Limit of Demagnifying Electron Projection Systems," *Int. Conf. on Microlithography* 1977 Paris, p. 167.

A. Oelmann et al., "Machine Time Calculation of Electron Beam Pattern Generators," *Int. Conf. on Microlithography* 1977 Paris, p. 171.

Miyauchi et al., "Computor Control of Maskless Ion Implanter with Au-Si-Be LM Ion Source for III-V Compound Semiconductors," *Nuclear Instruments and Methods in Physics Research*, V. 6, p. 183, 1985.

Murray, "Physics of Ion Beam Wafer Processing," *Semiconductor International*, p. 130, Apr., 1984.

(List continued on next page.)

OTHER PUBLICATIONS

Nehmiz et al., "An Approach To Correct the Proximity Effect in Electron Beam Proximity Printing," *J. Vac. Sci. Technol.*, p. 1291, 1981.

Politycki et al., "Demagnigying Electron Projection with Grid Masks," Springer-Verlag, 1978.

Sacher et al., "Novel Microfabrication Process Without Lithographt Using an Ion-Projection System," *Ion Implantation in Semiconductors*, p. 563, Plenum Publishing 1977.

Seliger, "A High-Intensity Scanning Ion Probe with Submicrometer Spot Size," *Applied Physical Letters*, 34 (5), p. 310, 1979.

Speidel et al., "Lithium-Ion-Beam Exposure of PMMA-Layers Without Proximity-Effect," *Optik* 54(5), pp. 439–444, 1979-1980.

Stengl et al., "Progress in Ion Projection Lithography," *Proceedings of the Fifth International Winter School on New Developments in Solid State Physics: Physics and Development of Submicron Structures*, Salzuburg, Austria 1988.

Stengl et al., "Ion Projection Lithography for Sub-Micron Modification of Materials," *Nuclear Instruments and Methods in Physics Research*, p. 987, 1987.

Stengl et al., "Ion Projection Lithography Machine IMPLM-01: A New Tool for Sub-0.5-Micron Modification of Materials," *Journal of Vacuum Science Technology*, p. 194, Jan./Feb. 1986.

Stengl et al., "Ion Projection Lithography," *Solid State Technology*, Feb., 1986.

Stengl et al., "Ion Projection Microlithography," *Solid State Technology*, p. 104, 1982.

Stengl et al., "Ion-Projection Microlithography," *Proceedings of the International Conference on Micro Lithography, Lausanne, Switzerland, 1981.*

Stengl et al., "Ion Projection Microlithography for Submicron Device Fabrication," *Journal of Vacuum Science and Technology*, p. 1164, May/Jun., 1981.

Stengl et al., "Ion-Projection-System for Microstructure Fabrication," *Proceedings Microcircuit Engineering* '79, p. 358, Sep., 1979.

Stengl et al., "Ion Projection System for IC Production," *Journal of Vacuum Science Technology*, p. 1883, vol. 16(6), Nov./Dec. 1979.

Stengl et al., "Ion Projection Lithography," *NATO Advanced Study Insititute Workshop on Emerging Technologies for In Situ Processing*, p. 1–8, 1987.

Stengl et al., "Ion Beam Lithography," *17th European Solid State Device Research Conference*, Bologna, Italy, 1987.

Stengl et al., "Electron-Beam, X-Ray, and Ion-Beam Techniques for Submicrometer Lithographies IV," *Proceedings of the SPIE*, p. 138–145, Mar. 1985.

Stengl et al., "Sub-0.1um Ion Projection Lithography," *Conference on Solid State Devices and Materials*, Tokyo, p. 29, 1986.

Stengl et al., "Sub-0.1-um Ion Projection Lithography," *Technical Proceedings*, Semi-Con/West, pp. 42–52, May, 1986.

Takayuki et al., "1:4 Demagnifying Electron Projection System," *Proceedings of the Eleventh Conference* (1979). *International On Solid State Devices*, Tokyo 1979, in the *Japanese Journal of Applied Physics*, vol. 19, p. 47, 1980.

Tarui, "(Invited) Basic Technology for VLSI," *Proceedings of the Eleventh Conference* (1979 *International*) on Solid State Devices, Tokyo 1979; in the *Japanese Journal of Applied Physics*, vol. 19, p. 15, 1980.

Tarui, "Basic Technology for VLSI (Part II)," *IEEE Transactions on Electron Devices*, vol. ED-27, No. 8, 1321, 1980.

Zapka et al., "Electron Beam Proximity Printing: Step and Scan Technique for Future Small Groudrule Lithography," *Microcircuit Engineering*, p. 265, 1985.

Zapka et al., "High Resolution Distortion Measurements of Electron-Beam Transmission Masks," *J. Vac. Sci. Technol.*, p. 140, 1985.

Zapka et al., "Precise Mask-To-Wafer Gap Sensing Established in the EBP-Lithography Tool," *Microelectronic Engineering*, vol. 3, p. 125–130, 1985.

IMS Press Release Disclosure, *Semiconductor International*, Jan. 1987.

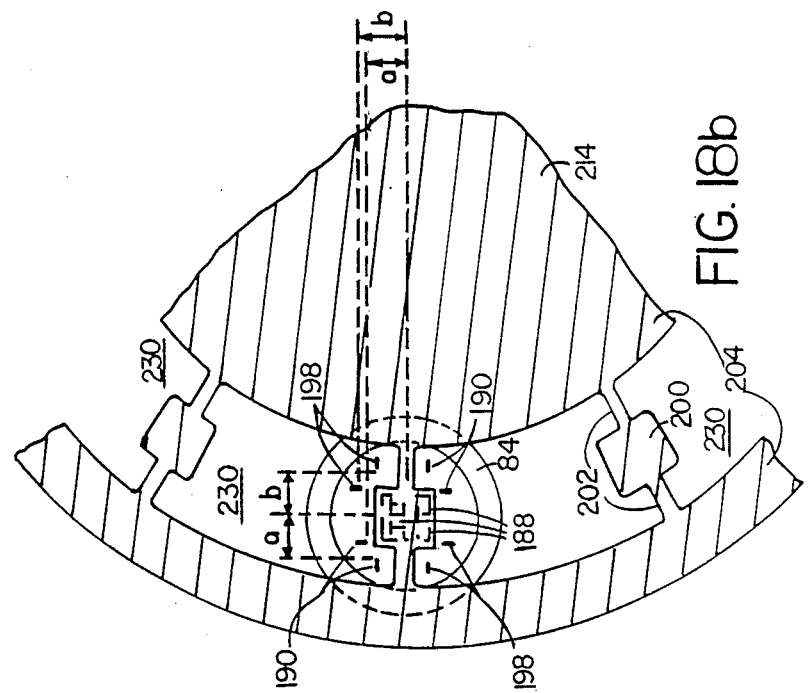
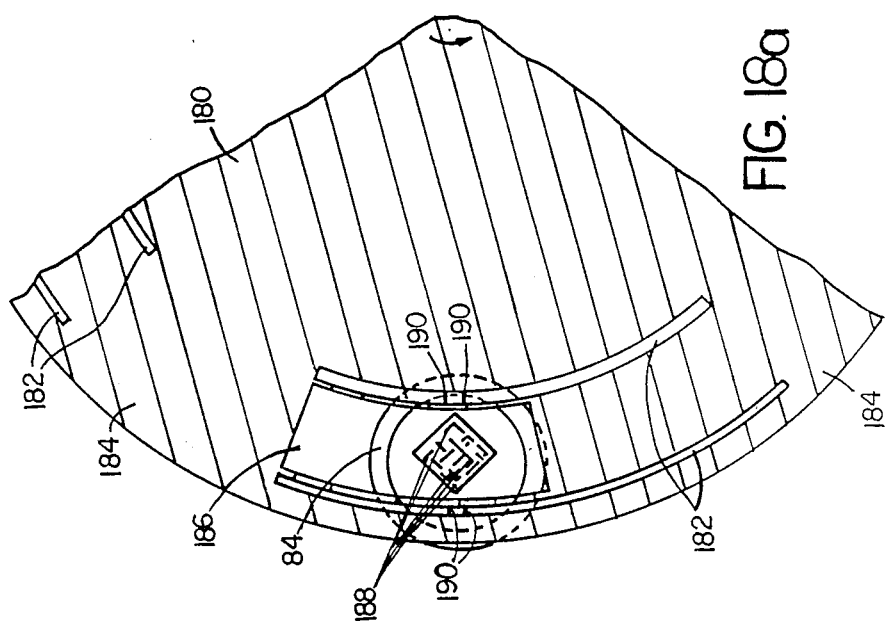
FIG. 18b
FIG. 18a

METHOD AND APPARATUS FOR IMAGE ALIGNMENT IN ION LITHOGRAPHY

This application is a continuation in part of copending U.S. patent application Ser. No. 07/050,978, filed May 15, 1987, now U.S. Pat. No. 4,823,011, and claims priority from Austrian patent applications Ser. No. 1404/87, filed June 2, 1987 and Ser. No. 118/88 filed Jan. 22, 1988.

This invention relates to ion beam projection lithography apparatus for manufacturing semiconductor devices and the like.

The entire content of U.S. patent application Ser. No. 07/050,978, filed May 15, 1987, is hereby incorporated by reference.

Of the various processes required to manufacture semiconductor devices, lithography is highly important. Simply described, the lithography process begins by coating a silicon wafer or chip with a thin photosensitive material called photo-resist, or simply "resist". A lithographic exposure tool projects an image of a pattern contained on a mask or reticle onto the resist-coated wafer. The wafer is stepped through a series of exposure positions by which the same pattern of the mask is exposed a number of times on the wafer. Development leaves a resist pattern that delineates the desired images on the wafer surface. The wafer is then subjected to any one of many possible processes such as etching, oxidation, ion implantation, diffusion, and deposition.

In the process of forming a pattern on a wafer to conform to a desired circuit design, it is often necessary to image several complementary mask patterns at a single chip position. To accurately produce the features of a given circuit, the various mask patterns must be carefully overlayed, and referencing of the die pattern with the wafer position is necessary. The demands on the quality of such overlay are becoming increasingly stringent as circuit features become smaller in accordance with trends in the microelectronic field.

SUMMARY OF THE INVENTION

The present invention provides a method and apparatus to accurately overlay dies or patterns on a wafer in ion projection lithography.

In one aspect, the invention provides real time measurement and adjustment of the position and size of the image field with respect to the existing pattern, during the time of exposure of the new field. It also provides the means to vary the relative X and Y magnification of the new field if the existing pattern field on the wafer has been distorted by processing. The invention also permits observation of any changes occurring in the image-forming system, such as changes which may be caused by shakes, or by a drift of the lens voltages which are derived from power supplies, and enables corresponding corrections to be performed while the image is being formed.

Numerous aspects of the invention employ an arrangement for positioning on a substrate an image of structures provided on a mask, in reducing or 1:1 ion projection lithography, wherein the mask has been provided with marks, which are imaged on a surface at the target station, which also carries marks, the ion beam is controlled to establish a coincidence of the marks on the mask with the corresponding marks on the carrier surface, and an ion projection system is used, which contains in its optical path an electrostatic multipole, particularly an octopole, which is adapted to be controlled by a control device, means for rotational adjustment of the image relative to the substrate such as means for establishing an axial magnetic field about the ion-optical axis, and means for correcting the scale of the image.

In an arrangement of this kind the invention features a shutter insertable in the ion path, in a first position the shutter being traversable only by ions passing through marks on the mask, and in a second position the shutter being traversable by ions passing through the marks on the mask and by ions forming an image of the desired structure, the shutter being shiftable selectively into the ion path so that in the first position the target station is exposed to the ion beam only through the marks, to enable coarse alignment of the system, and in a second position of the shutter the substrate is exposed to the image of the desired structure while the marks at the target station are exposed to ions passing through the marks on the mask to control alignment during exposure of the substrate. In certain embodiments, at least some of the marks at the target station are carried on the surface of the substrate itself while in other embodiments at least some of the marks are carried on the surface of a reference block to which the substrate is positionally related. Preferably the reference beams that are formed by the marks on the mask are scanned across the marks at the target station, preferably the beams being individually scanned.

According to one feature of the invention, the carrier for the marks is a reference block, which is disposed in a predetermined position relative to the wafer and is spaced from the wafer and is preferably parallel to the wafer and has an aperture corresponding in size to the mask image to be formed on the wafer so that the marks are disposed outside the optical path of the ion projection system used to generate the image on the wafer, detectors are provided for the secondary radiation emitted by the marks on the reference block and consisting particularly of secondary electrons which are due to the beams (reference beams) passing through the marks on the mask, and the signals from the detectors are adapted to be delivered to the control device for the multipole, particularly octopole, to the means for rotational adjustment of the image relative to the substrate and to the means for scale correction, which in case of a 1:1 shadow projection consists of a mechanical device for changing the elevation of the stage. The provision of the reference block results in shading the detectors against detection of secondary electrons which are due to ion beams which are incident on the wafer. As a result, the detectors are not subject to an influence which is exerted by the wafer and could affect the indication and, as a result, the correction.

In order to ensure that the wafer will correctly be positioned relative to the reference block, a further feature of the invention resides in that the reference block is provided with additional marks, e.g., in the form of a grating, for use in the positioning of the wafer relative to the reference block, the wafer is provided with marks, which correspond to the additional marks provided on the reference block, and optical aligning means are provided for detection of deviations from positional coincidence of the marks provided on the reference block and on the wafer. Such optical means may be designed, e.g., as has been described by B. S. Fay et al. in *SPIE* Vol. 632, "Electron-Beam, X-Ray, &

Ion Beam Technique for Submicrometer Lithographies V" (1986), on pages 146 to 155.

In accordance with a further feature of the arrangement of the invention, the optical means for the detection of deviations from positional coincidence of the line marks may be coupled to a control device for moving the stage.

In a first embodiment of the arrangement in accordance with the invention any displacement of the projected image of the reference beams is observed, particularly also during the exposure, and corresponding corrections are effected by control of the multipole and of the means for relative rotational adjustment so that a maximum stabilization of the image is achieved relative to the reference block. In that case the detectors for the secondary radiation which is emitted by the marks on the reference block may be provided in an even number and two of the pairs of the detectors may be used to control the multipole, one pair, which preferably cooperates with one of the pairs for controlling the multipole, may be used to control the means for relative rotational adjustment, and a further pair may be used to control a lens, which precedes the reference block, so as to enlarge or reduce the image. In that case, each pair of detectors have associated with them a straight-line mark on the substrate, two of the marks on the substrate are aligned with each other, a third mark extends on the substrate at an angle, preferably at right angle, to the two aligned marks, and a fourth mark on the substrate is parallel to and laterally offset from the third mark. The third mark extending at an angle to the two mutually aligned marks is disposed on the line of symmetry between the aligned marks. The straight-line marks are constituted by a metallic groove, which is preferably squarewall or V-shaped in cross-section.

The two detectors which are associated with respective straight-line marks are disposed on different sides of the associated mark outside the range of influence of particles which are emitted from other marks. This will ensure that a pair of detectors will detect only particles which have been emitted from the associated mark on the reference block.

In that embodiment, the relative position of the reference block and the stage can be checked in either of two ways:

(a) the deviation from a positional coincidence of the additional marks on the reference block and the associated mark on the wafer is continually detected during the exposure and is converted to a correcting movement such that the error is decreased below a threshold value; or (b) the positional coincidence of the additional marks on the reference block and the associated marks on the wafer is established by the optical aligning means before the exposure.

On the other hand, in a special embodiment of the invention the wafer position is checked during the exposure by means of an interferometer, particularly a laser interferometer, by which the actuators for the stage are activated. Actuators for adjusting the stage in two mutually orthogonal directions, which are at right angles to the optical axis of the ion projection system, may be associated with the stage as well as additional actuators for rotating the stage about the optical axis and actuators for changing the elevation of the stage. The correcting movements which are controlled by the interferometer are effected in such directions that the relative position which has been established between the reference block and the stage by the optical aligning means before the exposure will be maintained.

In another embodiment of the invention, the optical means for the detection of deviations from the positional coincidence of the line markings are coupled to the control device for the multipole and the means for relative rotational adjustment rather than to the actuators for the stage. In that embodiment the ion-optical path can be influenced in dependence of the deviation from positional coincidence of the line marks on the reference block and on the wafer. In the use of that embodiment the stage is moved to a position in which the marks on the wafer deviate by less than a predetermined extent, e.g., less than 1 um, from their desired position relative to the associated additional marks on the reference block (coarse alignment) and thereafter the interferometer is activated to act on the means for adjusting the stage and is maintained in an active condition at least until the exposure has been terminated. When the interferometer has been activated, the deviations from positional coincidence of the additional marks on the reference block and the associated marks on the wafer, which deviations have been detected by means of the optical aligning means, are ion-optically corrected before the exposure. That correction is effected in dependence on a predetermined functional relationship between the optically detected deviations and the magnitudes of the influences which are exerted on the ion-optical system to correct that deviation. Thereafter the exposure is performed. In that embodiment of the process a coarse alignment of the stage to the desired chip position relative to the reference block is effected first, the interferometer is subsequently activated to maintain the stage in its relative position to the reference block, and the optically detected deviation between the chip and the reference block is then ion-optically corrected. In that case it will be essential to determine the functional relationship (calibration curve) between the optically detected deviation and the action to be exerted on the ion-optical system to correct that deviation (action on the multipole to correct the beam in the x and y directions, strength of axial magnetic field or signals applied to other means for effecting relative rotational adjustment, and voltage applied to the lens system for scale correction). After the exposure, the detectors for the secondary radiation are reactivated to reestablish the coincidence of the marks on the mask with the marks on the reference block. For the exposure of another chip the interferometer is deactivated so that the stage can be moved to a new position relative to the reference block.

An exposure of a chip for a prolonged time may be performed in stages in that the exposure is succeeded by at least one further exposure so that one and the same chip is exposed through the same mask in at least one further stage. In that case the position of the beam relative to the reference block is corrected. To that end, the images of the marks on the mask are aligned by means of the secondary radiation detectors with the marks on the reference block between two consecutive exposures, whereafter the detectors are deactivated and the ion-optical system is then corrected in dependence on the optically detected deviation of the additional marks on the wafer. This is followed by a further exposure.

To increase the accuracy, the ion-optical correction may be effected in accordance with the calibrating curve also during the exposure in an operation performed on-line with the optical detection of the deviation of the additional marks on the reference block from the marks on the wafer.

In a third procedure, the stabilization of the image of the mask relative to the reference block is maintained (by means of the detectors), the position of the stage relative to the reference block is detected and deviations thereof are compensated for and all this is effected during the exposure of the chip. In accordance with the invention that is accomplished by subjecting only the reference beams to the influence of a field which can be varied with time and the reference beams are thus reciprocated, i.e. scanned, preferably at a constant velocity, on the reference block over a region thereof which contains the marks which are associated with the marks on the mask and when a mark, such as a pit or v-shaped groove, is being swept, the detector generates a maximum signal, a predetermined instantaneous value of the deflecting voltage for the reference beam, which deflecting voltage changes with time, is associated with the maximum signal, that instantaneous value is compared with a desired voltage value, which corresponds to the maximum detector signal that is obtained when the image of the mask structure is stabilized so that it does not move relative to the reference block and the reference beams are sweeping over a mark on the reference block, and the difference between the instantaneous value of the deflecting voltage and the desired voltage value is compensated for by a control of the image-forming optical system. For carrying out that method, the system in accordance with the invention comprises additional deflecting units such as octopoles, which are connected as electric dipoles and are provided to deflect only the reference beams. Such additional deflecting units do not act on the radiation from the mask structures proper. The deflection (scanning) of the reference beams can be effected, e.g., by the application of a sawtooth voltage to the octopoles connected as electric dipoles. If the sweep speed is not constant, its time function must be exactly known in each case.

When the image has been stabilized relative to the reference block, a maximum signal will be obtained from a reference mark on the reference block whenever the time-dependent voltage across the corresponding "reference octopole" reaches a certain fixed value $U_o$. Conversely, a change $\Delta U_o$ of the voltage value which is obtained when the maximum reference marks signal occurs will indicate a drift of the reference beams, i.e., of the image proper, and of the reference beams, e.g., by a distance $\Delta x$. Because the relationship of the deflecting voltage and the sweep time is predetermined and exactly known (e.g., in case of a constant speed) and the relationship of the deflecting voltage and the sweep distance is also predetermined and exactly known, the drift of the beam can be detected by a measurement of time or by a measurement of voltage. In that case the image will be stabilized with the aid of the ion-optical correcting units (multipole, axial magnetic field, change of voltage across the projection lens) and in such a manner that the detector signal which is due to the reference marks will always have a maximum magnitude when the same reference voltage $U_o$ is applied to the octopole and after the same interval of time $\Delta t_o$.

In addition, the optical aligning means are used to correct deviations of the position of the stage relative to the reference block in such a manner that the position of the beam relative to the reference block is still monitored. In that case a signal coming from the optical aligning means and indicating a change of the position of the stage relative to the reference block, as has been described, is transformed to a signal which is delivered to the ion-optical correcting unit and causes the latter to reestablish the coincidence of the image of the mask structures and of the corresponding structures on the chip. This will obviously involve also a shifting of the reference beams, i.e., in change of the voltage $U_o$ applied to the ion-optical correcting unit, by which the image will be stabilized relative to the reference block. But because the new value $U_o$ is definitely related to the signal coming from the optical aligning means, the stabilization of the image is controlled by the computer in dependence on that new value.

Apparatus of the invention, for an especially rapid alignment, images the complete structure of the mask, including markings of the mask, simultaneously on the substrate during the structure-forming exposure period, with the final alignment movements being performed simultaneously with this exposure.

To achieve the above, and still to prevent the imaging of the complete structure of the mask on the substrate, when the system is making coarse adjustments, at which time the image of the mask structure may be slightly shifted and thus lead to an error in the structure transferred to the substrate, we provide a special shutter. In one embodiment the shutter is shiftable into the beam path, i.e. by a rotating or linear shifting action.

The shutter can have an opening which can be traversed by the entire beam of radiation traversing the mask and also an arrangement of elongated throughgoing slots exclusively for the radiation beam which traverse the aforementioned markings on the mask. In one position of the shutter, therefore, only the mask markings can be imaged on the substrate whereas in the other position in which the opening is in the path of the beam, the entire structure of the mask is imaged upon the substrate.

Such a mechanical shutter may be reciprocable or rotatable, particularly revolving. In one embodiment a mechanical shutter may be disposed between the reference block and the projection lens and may be designed to shade off the image of the mask structure as well as the reference beams.

In another embodiment the shutter capable of functions as described above is positioned before the mask.

A mechanical shutter might also be installed between the reference block and the wafer although this will give rise to space problems. Such shutter would shade off only the image but would disturb the optical detection whether the additional marks on the reference block coincide with the associated marks on the wafer.

A mechanical shutter provided with apertures only for the reference beams might be arranged closely above the reference block. The use of such shutter will be considered when the time constant for the aligning of the marks on the mask with the associated marks on the reference block is not sufficiently short relative to the exposure time. In that case the aligning and the exposure may be performed in the following sequence. When the shutter has been closed, the marks on the mask are aligned with the marks on the reference block. This is possible because the shutter has apertures for the reference beams. When the shutter is still closed, the stage is moved to the new position The optical system is used to detect the deviation of the additional marks on the reference block from the marks on the wafer. The interferometer is activated to compensate any movement of stage relative to the reference block. The shutter is then opened and the ion image is held in position while the shutter is open. The deviation detected by the optical system is now corrected in the manner described hereinbefore by an adjustment of the stage or by an action on the ion beam.

All aligning steps described hereinbefore may be used in 1:1 ion projection lithography as well as in reducing ion projection lithography.

DESCRIPTION OF THE PREFERRED EMBODIMENT

BRIEF DESCRIPTION OF THE FIGURES

FIG. 18a shows an alignment shutter.

FIG. 18b shows an alignment shutter in modification of FIG. 18a.

DETAILED DESCRIPTION

Figure 1:
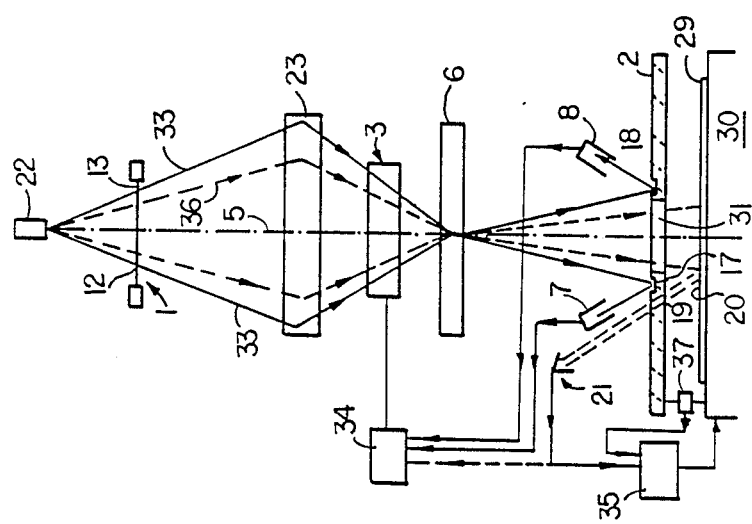
FIG. 1 is a schematic of a first embodiment of an ion lithography alignment system in accordance with the invention.

Referring to FIG. 1, a mask 1 is disposed in the optical path of beams coming from an ion source 22. The mask 1 is provided with a structure 32 (shown in FIG. 5), which is to be imaged on a substrate 29 by the ion projection system. The image of the mask structure 32 is to be formed on the substrate 29 in such a manner that a predetermined relative position of the image of the mask structure 32 and of an image which has previously existed on the substrate 29 is obtained. The mask 1 is provided with alignment apertures 11, 12, 13 which produce alignment beams 33 (apertures 11 and 12 are shown more clearly in FIG. 5 and apertures 12, 13 are exaggerated in FIG. 1) and images of the apertures 11, 12, 13 are formed on a reference block which is provided with alignment marks 16, 17 18 (shown more clearly in FIG. 15). The images of the apertures 11, 12, 13 of the mask 1 on the reference block 2 are adjusted to coincide with the respective corresponding marks 16, 17, 18.

An electrostatic multipole 3, particularly an octopole, which can be controlled by a control device 34, and means 4 (FIG. 5) for establishing an axial magnetic field about the optical axis are disposed in the optical path between the mask 1 and the reference block 2. In the embodiment of FIG. 1, the reference block 2 is parallel to the wafer 29. The reference block 2 has an aperture 31, which substantially corresponds in size to the image of the structure on the mask 1 which is to be formed on the wafer 29. The marks 16, 17, 18 on the reference block 2 are disposed outside the optical path 36 for the ions that form the image on the wafer 29.

Detectors 7, 8, 9, 10 (shown in FIG. 15) are provided to detect the secondary radiation which is emitted by the marks 16, 17, 18 on the reference block 2 or the wafer. The arrangement and function of the detectors will be explained more in detail hereinafter. The secondary radiation is due to the alignment beams 33 which have passed through the marks 11, 12, 13 on the mask and are incident on the reference block 2. The signals from the detectors 7, 8, 9, 10 are adapted to be delivered to the control device 34 for the multipole, particularly octopole, 3, and the means 4 for establishing the axial magnetic field. The provision of the reference block 2 affords the advantage that the beam is shaded off so that the detectors 7, 8, 9, 10 will not be influenced by radiation coming from the substrate 29.

The reference block 2 is also provided with additional marks 19, which may consist, e.g., of a grating. The wafer 29 is provided with marks 20, which correspond to the marks 19 and may also consist, e.g., of a grating. Optical means 21 are provided for detecting any deviation from the positional coincidence of the marks 19 and 20 provided on the reference block 2 and the wafer 29, respectively. As soon as a deviation from the positional coincidence has been detected, steps can be taken to correct this positional deviation. For instance, in one embodiment, the optical means 21 may be coupled to a control device 35 for moving the stage 30 to which the wafer 29 is secured. In that case, signals from the optical means 21 are delivered to the control device 35 for moving the stage. The stage may consist of an x,y stage, which is movable in two directions, which are at right angles to each other. In that case the control device 35 will control the motors for moving the stage 30.

Alternatively, the optical means 21 may be coupled to the control device 34 for the multipole 3 and the means 4 for producing the axial magnetic field. In that case the position of the projection beam 36 and the position of the reference beam 33 are changed in dependence on the magnitude of the deviation from the positional coincidence of the line marks 19 and the line marks 20.

The interferometer 37 may be disposed between the reference block 2 and the stage 30. In case of a movement of the stage 30 relative to the reference block 2, that interferometer delivers signals to the control device 35 for the stage 30 so that the latter will be restored.

Figure 2:
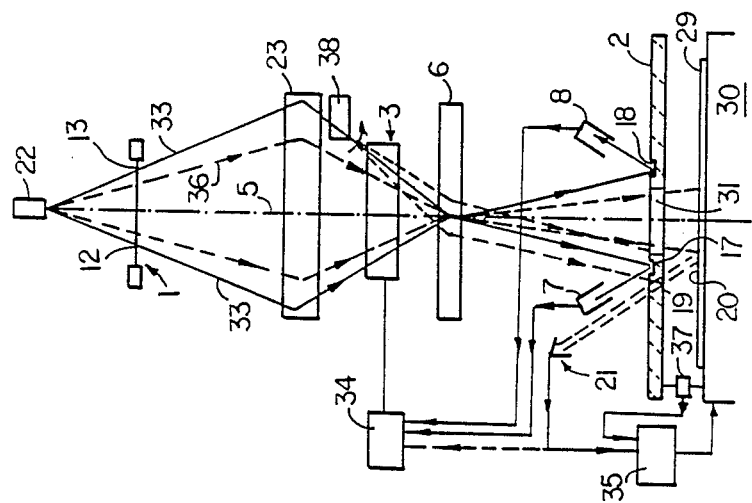
FIG. 2 is a schematic of a modification of the system of FIG. 1 including separate scanning of alignment beams from the die field.

Referring to another embodiment shown in FIG. 2, deflecting means 38, such as octopoles connected as an electric dipole array, are disposed in the optical path only for the reference beams 33. This arrangement can be used to compensate changes of the ion-optical image-forming properties, e.g., a drift of the image caused by voltage fluctuations, e.g., on the accelerating line, even during the on-line alignment effected by a displacement of the image. In that case the reference beams 33 are continually scanned over the marks of the reference block 2 during the aligning and the exposure and that scanning may be effected by a sawtooth voltage applied to the deflecting units 38. The beams 36 which form the image proper of the structures 32 on the mask will not be influenced by the deflecting units 38.

Figure 3:
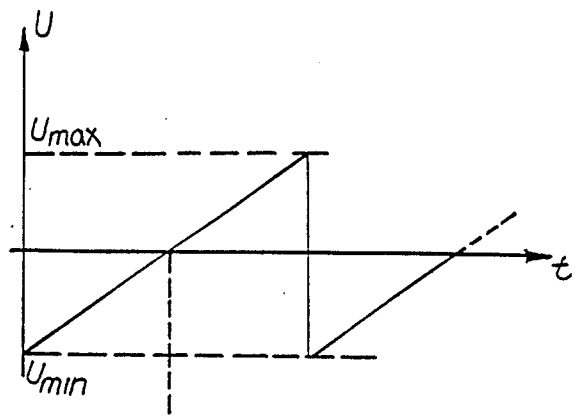
FIG. 3 is a schematic of the voltage controlling the means for deflecting the reference beam and the deflection of the reference beam plotted against time for the system shown in FIG. 2.
Figure 3:
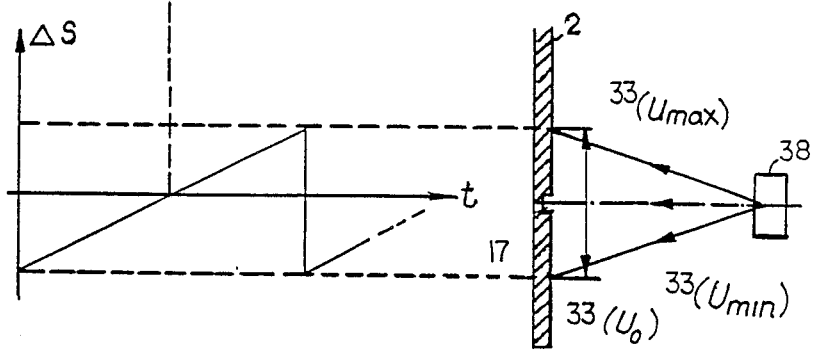

Referring now to FIG. 3, an idealized representation is provided of the conditions which will be obtained when a sawtooth voltage is applied to a deflecting unit 38 and the wafer stage 30 is exactly aligned with the reference block 2 so that no signal is being delivered by the optical means 21. When the desired voltage $U_o$ assumed here to be zero is applied, the reference beam 33 will be incident exactly on the associated reference mark 17 on the reference block 2. The distance s, which is swept by the reference beam is determined by the difference Umax−Umin between the maximum and minimum voltages.

Figure 4:
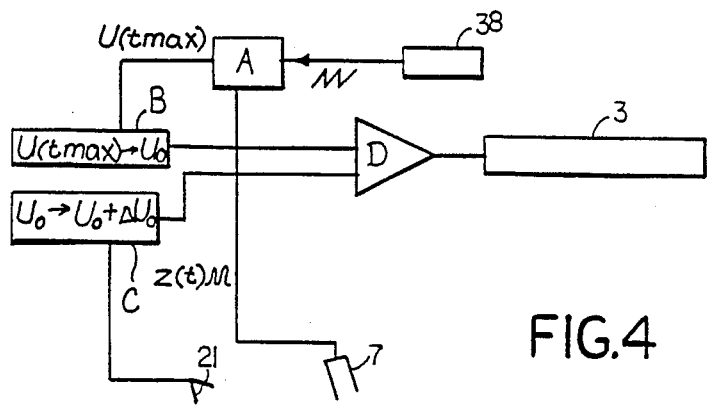
FIG. 4 is a block circuit diagram illustrating the control of ion optics elements in response to signals produced by the alignment beams.

Referring now to FIG. 4 a block circuit diagram illustrates the control of the ion-optical correcting elements 3 by the detectors 7, 8, 9, 10 for the reference marks 16, 17, 18 so as to stabilize the ion-optical system (only the detector 7 is shown) and by the optical means 21 (for correcting displacements of the wafer 29 relative to the reference block 2). Whenever the voltage which is delivered by the detector 7 and is proportional to the counting rate reaches a maximum, the unit A measures the voltage which is applied to the octopole 38 and the voltage $U_{(tmax)}$ is applied to the unit B. In that unit, $U_{(tmax)}$ is compared with the desired voltage $U_o$, which is that voltage which should be applied to the octopole 38 at the time when the reference beam is sweeping the associated reference mark on the reference block 2 and the stage 30 is ideally aligned. The measured difference is converted to a corresponding signal to be delivered to the ion-optical correcting elements 38 so that the reference mark will be swept when the desired voltage $U_o$ is applied. If the optical means 21 measures a deviation of the wafer 29 relative to the reference block 2, a corresponding signal will be transmitted to the unit C and will be converted in this unit to signals for an ion-optical correction by which the entire ion beam, inclusive of the portion formed by the reference beams 33, is deflected or rotated. Now the alignment beam 33 will sweep the associated reference mark at a time when a voltage $U_o + \Delta U_o$ is applied rather than the voltage $U_o$. $\Delta U_o$ is definitely determined by the optical means 21. The signals from B and C are added in the unit D and delivered to the elements 6 (projection lens) for correcting the ion beam.

By the control of the ion beam, the marks 11, 12, 13 on the mask 1 (FIG. 5) are caused to coincide with the respective corresponding marks 16, 17, 18 on the reference block 2. As in the embodiment shown in detail in FIG. 5, the means for controlling the ion beam comprises an electrostatic multipole 3, which is disposed in the optical path between the mask 1 and the reference block 2 and which in the present illustrative embodiment consists of an octopole. The optical path contains also means 4 for establishing a rotating magnetic field about the optical axis 5 and a projection lens 6, which can be controlled by the voltage which is applied so that the scale of the image can be changed by a change of the voltage applied to the projection lens 6. An immersion or gap lens 23 is also disposed between the mask 1 and the multipole 3.

Figure 5B:
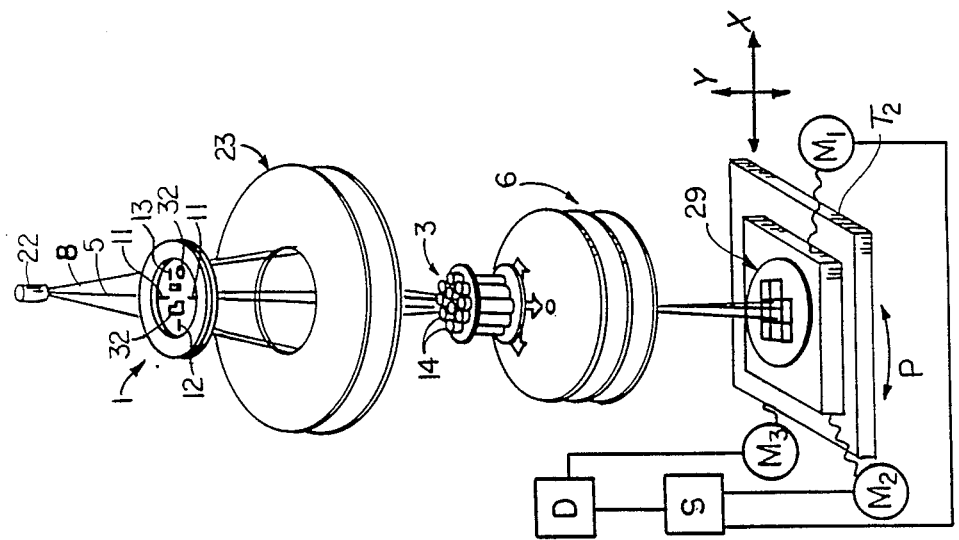
FIG. 5b shows the apparatus of FIG. 5 with alternate means for controlling the rotational orientation of the wafer.
Figure 5A:
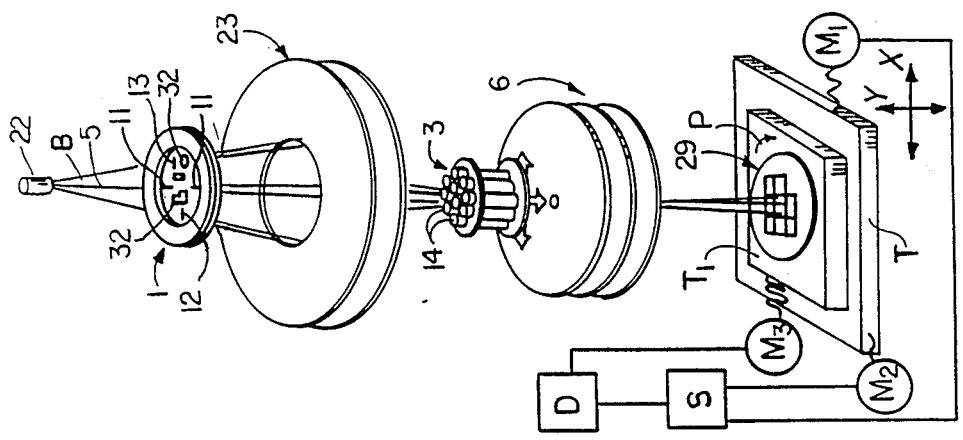
FIG. 5a shows the apparatus of FIG. 5 with means for controlling rotational orientation of the wafer.

In the embodiment of FIG. 5a correction for the rotation of the image upon the wafer is controlled by providing a rotating wafer support $T_1$ driven by motor $M_3$ and capable of rotatably positioning the wafer in the direction of the arrow P in response to signals generated by the alignment beams.

Referring to FIG. 5b an embodiment is shown in which the XY table T is supported by a rotary table $T_2$ driven by motor $M_3$ for rotary motion of the wafer in the direction of the arrow P in response to the signals generated by the alignment beams for rotary correction of the image upon the wafer.

Figure 5:
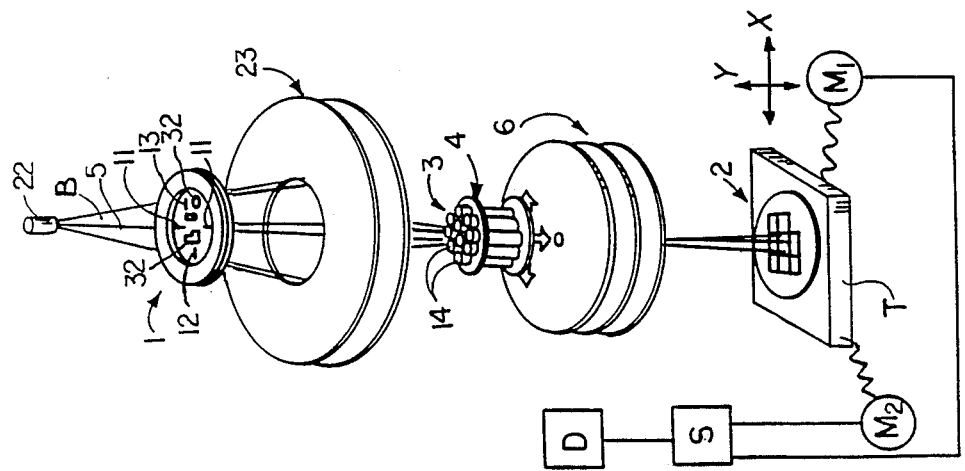
FIG. 5 is a more detailed 3-dimensional view of the components of an ion lithography system to illustrate means which can be used to establish a coincidence of marks on the mask and of corresponding marks on the reference block.
Figure 5C:
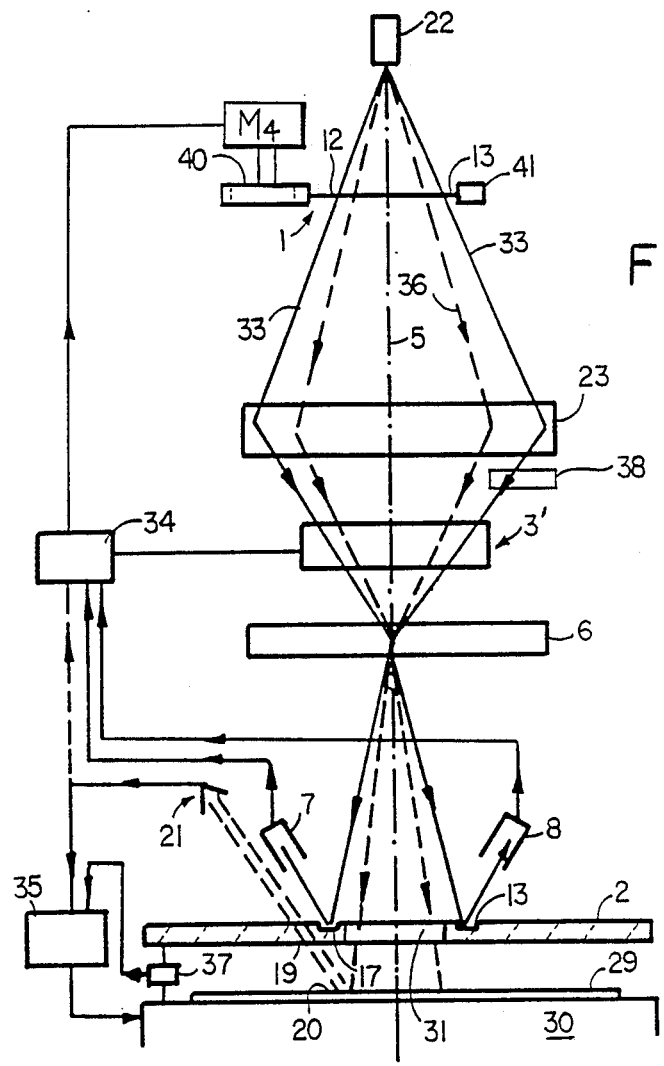
FIG. 5c is a schematic of the system in FIG. 2 with means provided for rotation of the mask.

In the embodiment shown in FIG. 5c, the mask 1 may be rotated by motor M4 which is coupled via a gear means 40, 41. The mask may be rotated in dependence with signals from the control unit 34 responding to signals generated by alignment beams.

Figure 15:
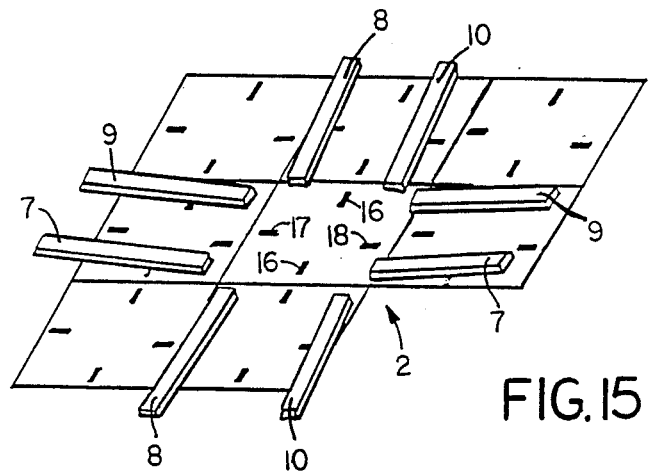
FIG. 15 illustrates an arrangement of the detectors above the reference block.

As is shown in more detail in FIG. 15, detectors 7, 8, 9, 10 are provided, which during a projection of the marks 11, 12, 13 on the mask 1, on the reference block 2 will deliver a voltage which corresponds to the secondary radiation emitted by the marks 16, 17, 18 on the reference block 2. The detectors are even in number. In the illustrative embodiment shown, a total of eight detectors for the secondary radiation are provided. Two pairs 7, 8 serve to control the multipole 3. Whereas one pair 9 may control the means 4 for controlling the rotating magnetic field, it is preferred to control the means 4 for establishing the rotating magnetic field by means of the pair 9 in cooperation with one pair 8 of the pairs 7, 8 used to control the multipole 3. The pair of detectors 10 control the voltages applied to the projection lens 6 so that said voltage can be changed to increase or reduce the scale of the image of the structures of the mask 1 on the reference block 2.

Figure 11:
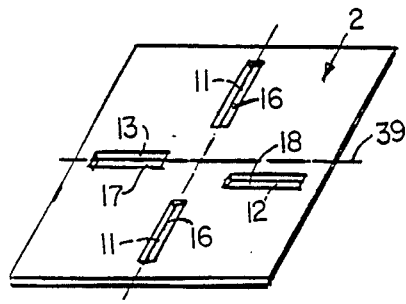
Figure 12:
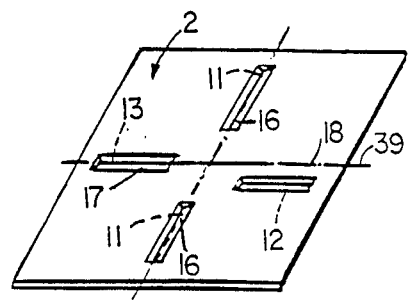

The multipole 3 can be controlled to effect a deflection of the beam in the X and Y directions (FIG. 5). The detectors may consist of commercially available electron multiplier channels, which cause the control voltage $U_o$ to be generated by means of the succeeding electronic circuitry (FIG. 13) in dependence on the electrons which have been detected. One of the straight-line marks 16, 17, 18 on the reference block 2 is associated with each pair of the detectors 7, 8, 9, 10. The association is such that two straight-line marks 16 are mutually aligned on the reference block 2 and a third straight-line mark 17 is at right angles to the two mutually aligned marks 16. Finally, a fourth straight-line mark 17 is provided on the reference block 2 and is parallel to but laterally offset from the third mark 17. The mark 17 lies on the line of symmetry 39 between the two mutually aligned marks 16 so that in case of a non-coincidence of the mark 18 disposed outside the line of symmetry 39 with the associated image of the mark 13 on the mask 1 the coincidence can be established by a change of the scale of the image (FIGS. 11, 12).

The arrangements of the marks 16 to 18 on the reference block 2 is particularly clearly apparent from FIGS. 9 to 12 and 15. In the illustrative embodiment shown, the straight-line marks 16 to 18 on the reference block 2 consist of V-section grooves.

Figure 6:
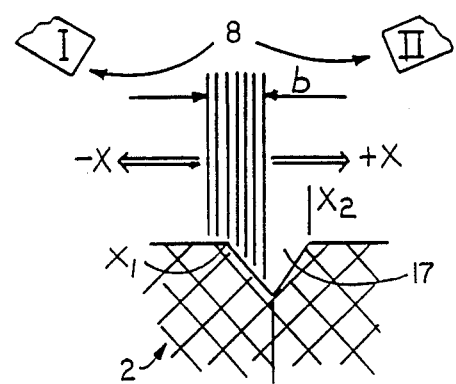
FIG. 6 is an illustration of a measuring system for detecting the secondary radiation resulting from a beam which is directed to a mark on the reference block.
Figure 7:
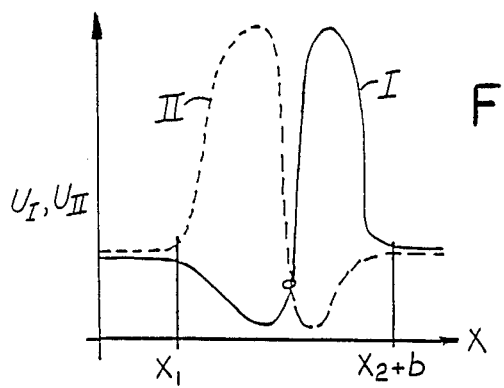
FIG. 7 is a plot of the dependence of the voltages generated by the detectors which are associated with the marks on the reference block.
Figure 8:
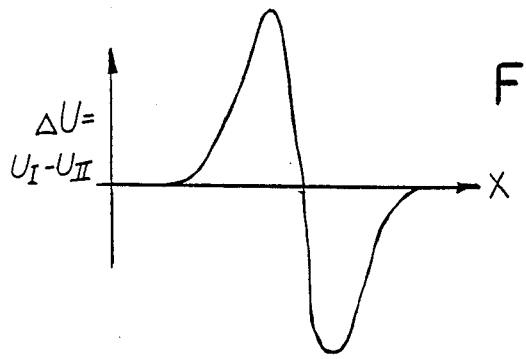
FIG. 8 is a diagram representing the voltage differences.

From FIG. 6 considered in conjunction with FIGS. 7 and 8 it is possible to understand the operations which are performed when a beam is sweeping in the direction X over a mark 17 consisting of a V-shaped groove. The width b of the beam may be about 1 μm. It is assumed that the movement of the beam in the direction X is caused by an electrostatic control of the beam. In FIG. 6, the detectors of the pair 8 are designated I and II. During a movement of the beam in the positive X direction the action of the mark 17 begins at the point $X_1$ and terminates at the point $X_2+b$.

The voltages generated by the detectors I and II during the movement of the ion beam are a measure of the secondary radiation which has been detected by the detectors and are apparent from FIG. 7, in which the voltage delivered by the detector II is represented by a broken line and the voltage delivered by the detector I is represented by a solid line.

The difference $\Delta U$ between the voltages $U_I$ and $U_{II}$ is apparent from FIG. 8.

Figure 13:
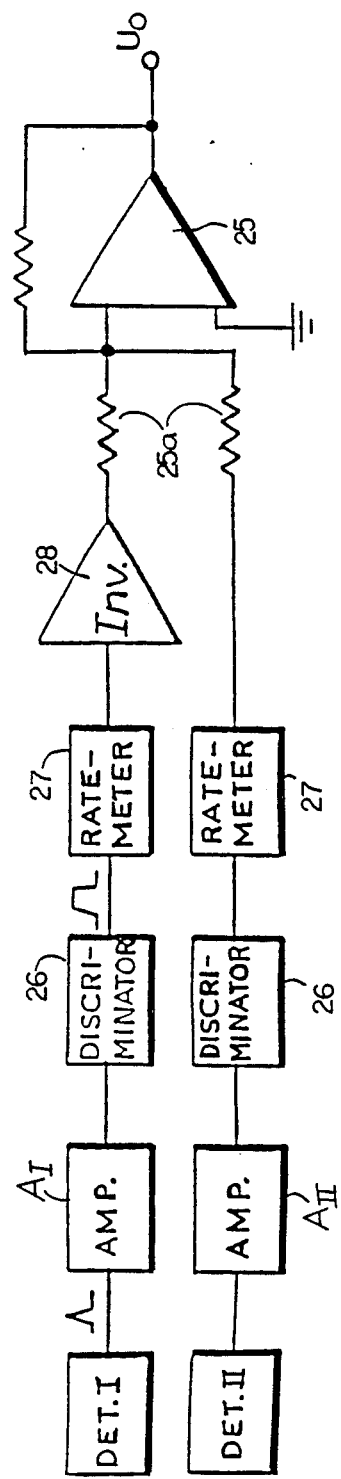
FIG. 13 is a block circuit diagram illustrating the means for controlling the ion beams.

It is apparent from FIG. 13 how the voltage signals which have been generated by the two detectors which are associated with a mark, such as the mark 16 in FIG. 15, are converted to the control voltage $U_o$, e.g., for a deflection in the X direction. The pulses delivered by the detectors are amplified and by the discriminators 26 are converted to rectangular pulses and are then integrated in the rate meter 27, e.g., an integrator, to generate a voltage which is proportional to the pulse rate. The resulting voltage which has originated at one detector (detector I) is inverted to its negative value by an inverter 28 so that the operational amplifier 25 is controlled by the difference between the voltages which have been delivered from the two detectors I, II. In dependence on the marks from which the signal has originated the output voltage $U_o$ of the operational amplifier 25 is used to control the multipole 3, to generate the rotating magnetic field or control rotation of the mask or wafer or to control the projection lens 6.

Figure 14:
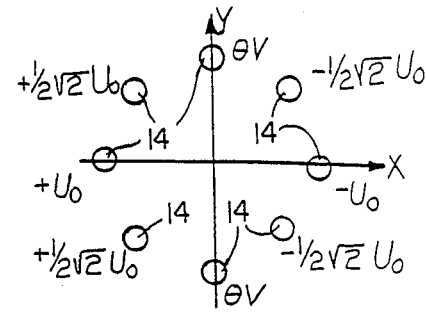
FIG. 14 illustrates an example of the activation of the poles of a multipole.

FIG. 14 shows by way of example how the voltage $U_o$ is applied to an octopole so that the latter will effect a deflection in the X direction. Because a deflection in the Y direction is usually required at the same time, whenever a signal $U_Y$ is delivered by the detectors which are associated with the corresponding mark (17 in FIG. 15 and in FIGS. 9 to 12), the two voltages $U_o$ and $U_Y$ must be vectorially added by a suitable circuit. The resulting sum voltages are applied to the corresponding poles of the octopole.

In analogy to FIG. 14, the output voltage $U_o$ of the operational amplifier 25 is used to cause in the coil 14 a current flow for rotating the projected image, and to control the projection lens 6 for scale correction.

It is apparent from FIGS. 9 to 12 how the projections of the marks 11, 12, 13 on the mask 1 are aligned with the marks 16, 17, 18 on the reference block 2. The projections of the marks on the mask 1 are represented by broken lines and provided with the same designations as the associated slots of the mask 1. The slots of the mask 1 need not be constituted by a single slot but a slot may be constituted by a plurality of mutually aligned apertures of the mask 1 so that an image such as that designated 11, 12, 13 in FIGS. 9 to 12 will be formed.

Figure 9:
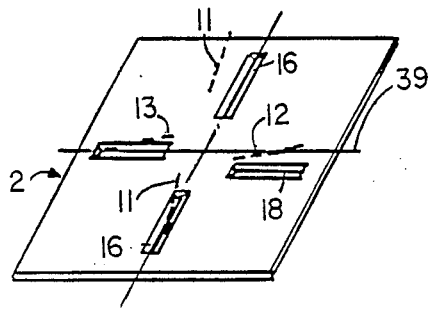
FIGS. 9 to 12 are exaggerated, enlarged views showing different relative positions of the mark on the reference block and the projection of the apertures on the mask.

FIG. 9 shows the relative positions of the marks 16, 17, 18 on the reference block 2 and of the images 11, 12, 13 of the marks on the mask 1 after an adjustment in the X direction has been effected.

Figure 10:
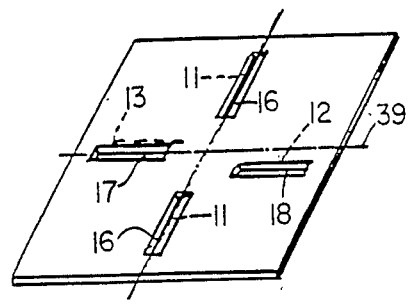

FIG. 10 illustrates the condition which will be obtained after a rotation of the projected image of the mask structure. It will be apparent that the images of the marks 11 on the mask 1 coincide with the apices of the V-shaped marks 16 on the reference block 2. When the projected image of the mask structure is then displaced in the Y direction, the detectors associated with the marks 16 on the substrate will not be affected by that displacement so that the movements of the image in the different directions are decoupled from each other.

FIG. 11 shows the condition which will be obtained after an adjustment in the Y direction. The image of the mark 13 on the reference block 2 is now disposed at the apex of the V-shaped groove 17 of the reference block 2. In that case the only mark which generally does not coincide with the corresponding image of a mark on the mask 1 is the mark 18, which is parallel to but laterally offset from the mark 17 and offset from the line of symmetry 39.

In order to move also the image of the mark 12 on the mask 1 to the apex of the mark 18 of the reference block 2, the scale must be changed by a change of the voltage applied to the projection lens 6.

The position obtained after a change of scale is represented in FIG. 12, from which it is apparent that after a previous adjustment in the X and Y directions and a rotation and change of scale the images of the marks 11, 12, 13 of the mask 1 on the reference block 2 coincide with the straight-line marks 16, 17, 18 provided there so that the projected ion image of the mask 1 is properly aligned with the reference block 2. Whereas the adjusting steps have been described as consecutive steps hereinbefore in order to facilitate the understanding, they are suitably performed at the same time because mutually decoupled feedback control systems are employed.

The two of the detectors 7, 8, 9, 10 which are associated with each of the straight-line marks 16, 17, 18 on the reference block are disposed on different sides of the mark concerned and it is ensured that only particles from the associated mark will be detected.

As soon as the alignment of the marks 11, 12, 13 on the mask 1 with the marks 16, 17, 18 on the reference block 2 has been completed and a position corresponding to that shown in FIG. 12 of the drawing has been reached, a hold circuit may be used to store the current and the voltage so that the position which has been obtained will be stabilized.

Figure 16:
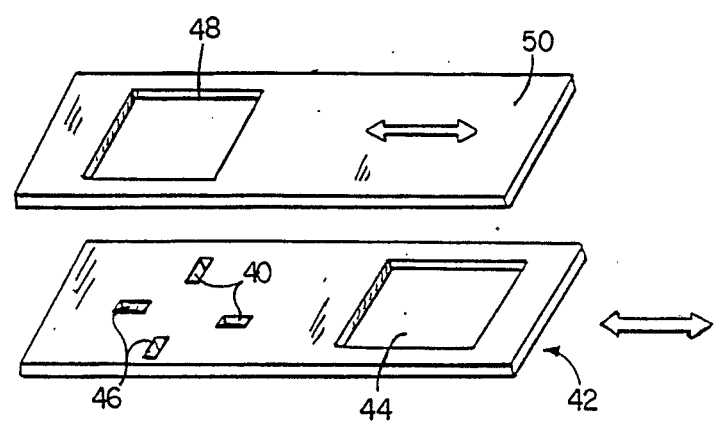
FIG. 16 is a schematic of a shutter arrangement in accordance with the invention.

During the mechanical table movement which may follow the exposure of one chip and precede the exposure of the neighboring chip, no ion beam is trained on the substrate. To this end, the shutter 42 as shown in FIG. 16 may be used, the ion beam being blocked by the primary shutter element 50. The primary shutter element 50 is provided a window 48 allowing exposure of the entire mask. Instead of a mechanical primary shutter, we also make use of an electronic deflection of the total ion beam from impingement upon the substrate to impingement upon a baffle plate located adjacent the wafer or deflection away from the mask by deflection means between the source and mask.

Since the alignment of the mask image on the substrate 2 can be effected by deflection of the projection image and this deflection can be effected unusually rapidly, for example, in several milliseconds over a total exposure time of one second, it is possible to image the entire structure of the mask including the markings 11, 12, 13 simultaneously onto the chip even during the electronic alignment process without having noticeable signal errors in the exposure. In this case, the full intensity of the ion beam is directed against the substrate during alignment and exposure.

If this, however, proves not to be satisfactory, it is desirable to utilize the shutters of FIG. 16 so that only the markings 46 are placed in the path of the ion beam for alignment, whereupon the window 44 can be aligned with the window 48 in the path of the beam to effect the exposure.

As soon as alignment is completed, i.e. the position of the ion beam indicated in FIG. 12 is reached, the control current and voltage are maintained utilizing a hold circuit so as to stabilize the aligned positions whereupon the shutters are shifted to allow the full structure of the mask 1, namely, the working structure 32 to be imaged on the substrate 2.

Figure 17:
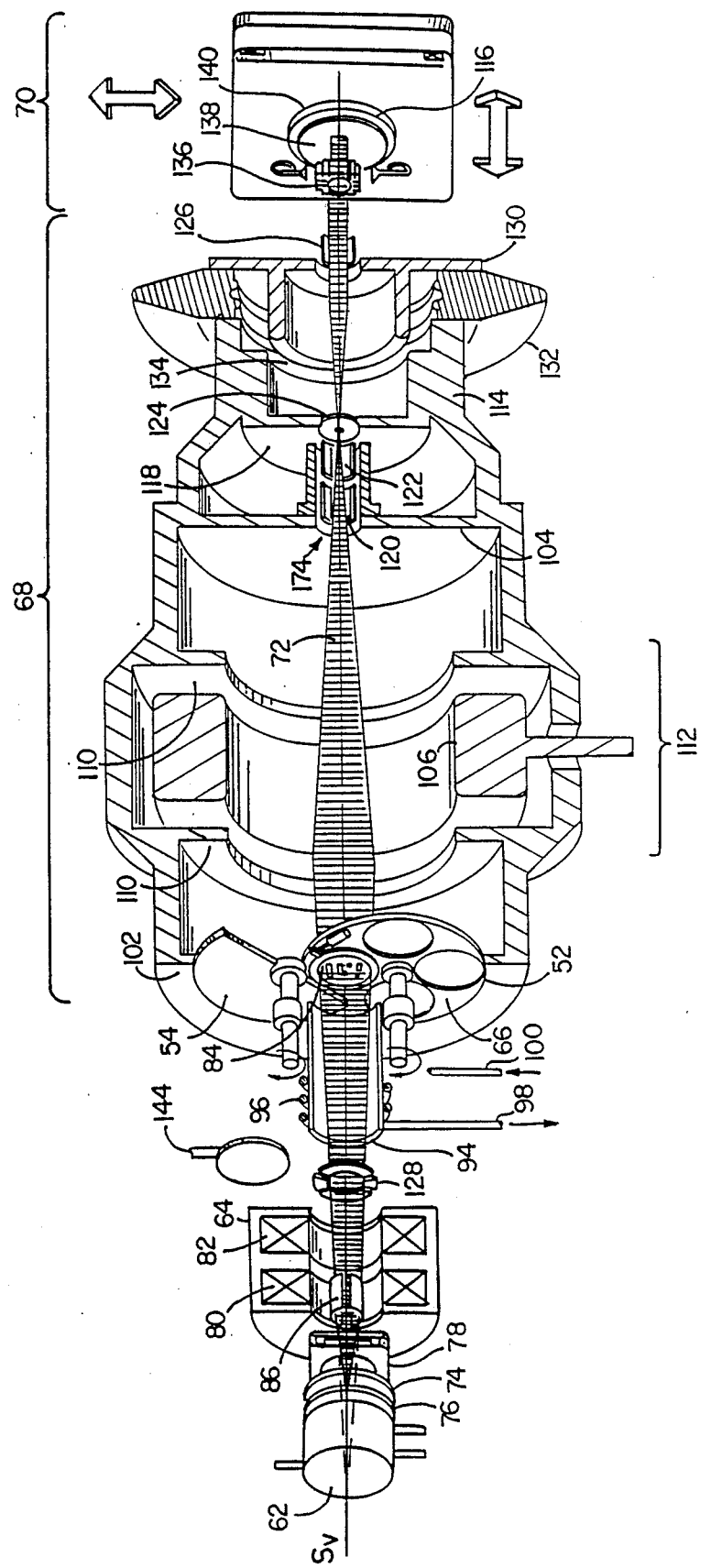
FIG. 17 is a three-dimensional cutaway view indicating the ion beam trajectories and the inner components of another ion beam lithography apparatus according to the invention.
Figure 18:
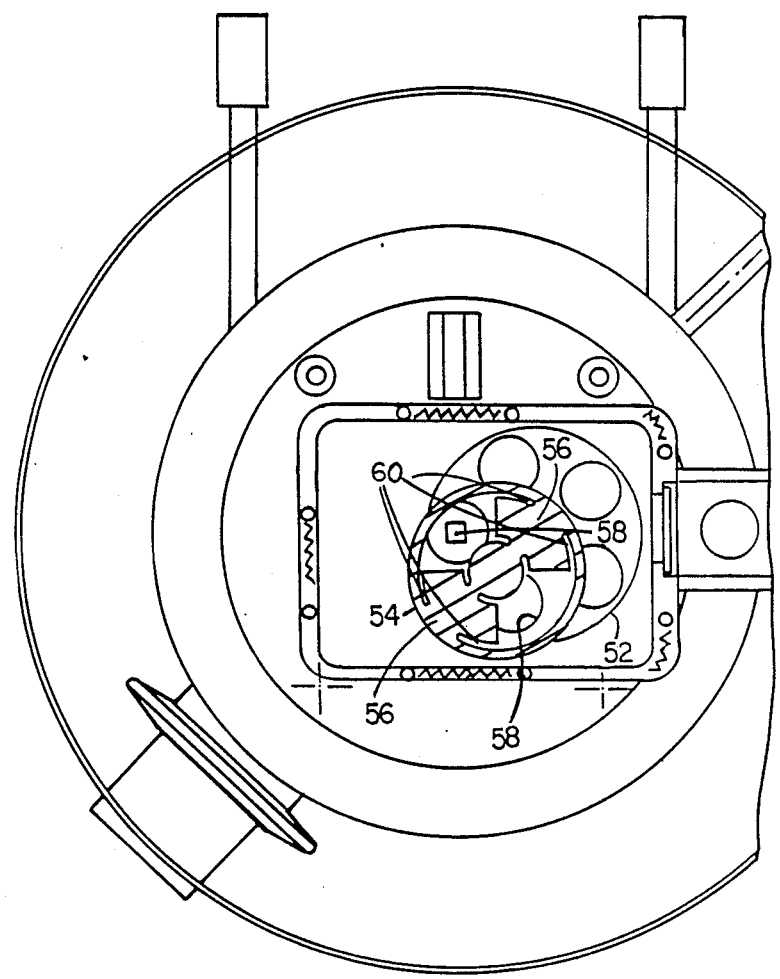
FIG. 18 is a view of the mask carousel and beam shutter of the embodiment of FIG. 17.

Referring now to FIG. 18, there is shown a rotary shutter assembly 54 and a mask carousel 52 which is positioned before the ion optical lens system of FIG. 17 and allows passage of eight alignment beamlets. (The shutter is shown only diagrammatically in FIG. 17.) In FIG. 18 the carousel 52 and shutter assembly 54 are viewed along the optical axis from the source. The carousel in this embodiment holds for example, four complementary masks that make up an entire pattern plus one metrology mask that is put in position in a metrology mode to measure machine distortion. The carousel rotates so that a mask comes into the axis of the column. When in position on the column a separate mechanism (not shown) clamps the mask to the back wall of the first lens. Opposite the position of the mask, there may be a vacuum lock chamber holding other masks and a mechanism that loads and unloads the masks from this carousel (not shown). Once a set of masks is unloaded then a vacuum well is used to isolate that set from the main chamber and that set can be removed and replaced with another set.

The rotating mechanical shutter 54 is used to control the exposure time. There are two shutter positions 56 which cover the mask and prevent exposure and two shutter positions 58 where the mask is fully exposed. Arcuate slots 60 in the shutter 54 are shown in FIG. 18. These allow the beam alignment function to occur without exposing the central die field of the mask. For example, just prior to exposure of the die field the shutter can be positioned such that three pairs of alignment marks in the mask are exposed to the beam through the slots. This is sufficient to determine five alignment parameters: X and Y translation in the wafer plane, rotation $\theta$ and magnification $M_X$ and $M_Y$ with the resulting signals from the detectors and the sixth reference beam or beamlet being used to provide an error signal as a measure of the accuracy of the other beamlet signals. Once these parameters are established, exposure may begin. At some point during the exposure, during rotation of the shutter, one of the pairs is interchanged for another pair of alignment marks so that when the exposure is terminated the alignment has been retained right through exposure. The exposure shutter may likewise be used in coordination with an electrical shutter positioned, for example, between the source and the mask for the purpose of deflecting the beam from the mask between exposures.

Referring now to FIG. 18a, another embodiment of the shutter is shown. A portion of a shutter 180 is shown which rotates about an axis that is disposed outside the optical path and has two concentric, elongated openings 182, which mainly consist of continuous openings having the configuration of a sector of a ring centered on the rotational axis of the shutter. The ring of solid material disposed between the two openings 182 is connected by supporting lands 184 to the carrying disc of the shutter 180. That shutter ring sector which is disposed between the two ring sector-shaped openings 182 is formed with an opening 186. Adjacent openings 182 are sufficiently spaced apart so that the solid portions of the ring disposed between the openings 182 will be able to cover the active area 188 of the mask 84 which defines the exposure field.

The elongated openings 182 are so arranged that they will always lie above the alignment marks 190 of the mask 84. Because the ring sector-shaped openings 182 are continuous with the exception of the supporting lands 184, the alignment marks 190 of the mask 84 will substantially permanently be irradiated so that a highly exact alignment of the mask with the structure to be formed will be enabled even when the substrate is not irradiated through the design structures 188 of the mask 84. Owing to the solid portions provided between the openings 186 in the ring between the two elongate openings 182, the active area 188 of the mask 84 can be covered or can be irradiated as required if the shutter 180 is pivotally moved to a position in which an opening 186 exposes the entire active area 188 of the mask 84. As has been mentioned hereinbefore, the alignment marks 190 of the mask 84 will lie within the irradiated area in any position which can be assumed by the shutter 180 so that the exact adjustment of the mask can be checked at any time and the projected area can be aligned with the substrate even during the exposure through the design structure.

Figure 18C:
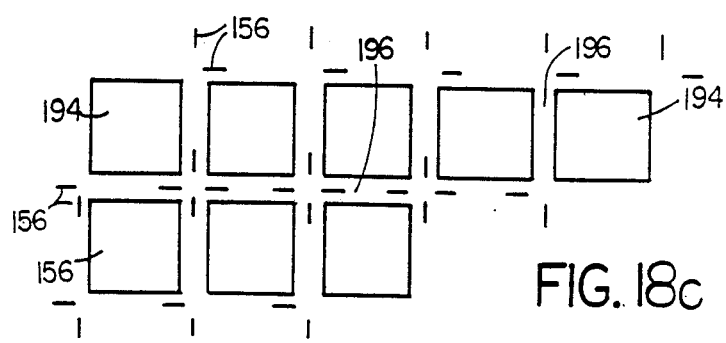
FIG. 18c illustrates the use of a mask having four alignment openings and of the wafer having corresponding marks.

Referring now to FIG. 18c, if the alignment structures of the mask are arranged as shown in FIG. 18a, the projected ion image can be aligned by movements in the X and Y directions and by a rotation and by a change of scale. Chip areas 194 on the substrate may be exposed through design structure 188 in such a manner that the reference beamlets which correspond to alignment structures of the mask and alignment reference beamlets of corresponding cross-sectional length can be used; this is of high importance for the accuracy and speed of the aligning operation. Because the alignment openings of the mask are disposed at the edge of the field which is irradiated by the ions on the mask 84, the reference beams for aligning and the registration marks are spaced apart as far as possible; this is highly desirable for the precise adjustment of the angular position and of the scale.

Figure 18D:
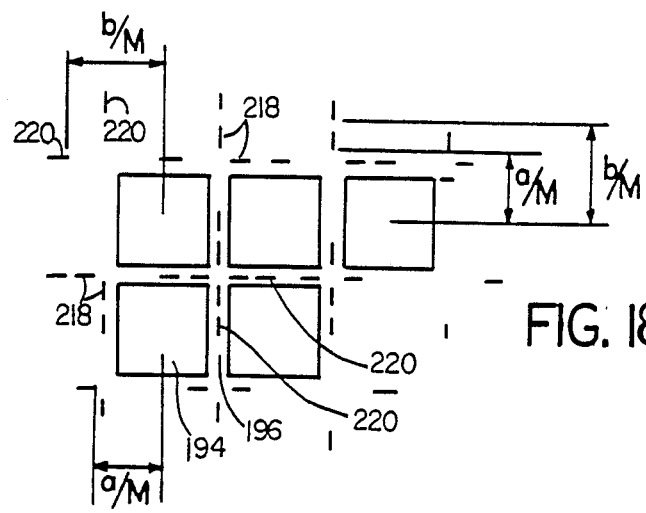
FIG. 18d illustrates an embodiment of FIG. 18c, where as many as eight beams corresponding to the alignment mark openings are used together with corresponding registration marks on the wafer.

An example of an arrangement for eight alignment structures is shown in FIG. 18b together with a suitable alignment shutter, which in the concrete example is rotatable. In that example the alignment openings 190 of the mask 84 are spaced a distance a from the center of the mask 84 and the alignment openings 198 are spaced a distance b in the x and y directions. In the position shown in FIG. 18b a widened portion 200 of supporting lands 202 of the shutter 214 covers the design area 188 of the mask 84 and the areas of the alignment openings remain exposed. The reference beamlets can be directed to the registration marks 218 and 220, which are shown in FIG. 18d and disposed in the scored valleys 196. The registration marks are spaced by the distances a/M and b/M from the centers of the chip areas (projection design structures), where M is the reproduction scale of the lithographic set-up. As a result, the projected ion image can be aligned by a movement in the X and Y directions and by a rotation and change of scale and it is also possible to detect particularly anamorphistic distortions, of the projected ion image. For instance, an anamorphistic distortion may be caused due to the fact that the reproduction scales in the X and Y directions are different. In that case it will be sufficient for a detection of that difference between $M_X$ and $M_Y$ to provide a fifth alignment reference beamlet and a corresponding registration mark on the substrate. The image distortions which have thus been detected may be electronically corrected in ion-projecting systems.

When the alignment has been effected, the alignment shutter 214 is moved to a position for an exposure of the chip through the structures of the design area 188. As the aligning operation is interrupted only for a short time by the movement of the shutter, the alignment of the projected ion image with the registration marks on the wafer can be maintained almost throughtout the exposure of the chip.

Figure 18E:
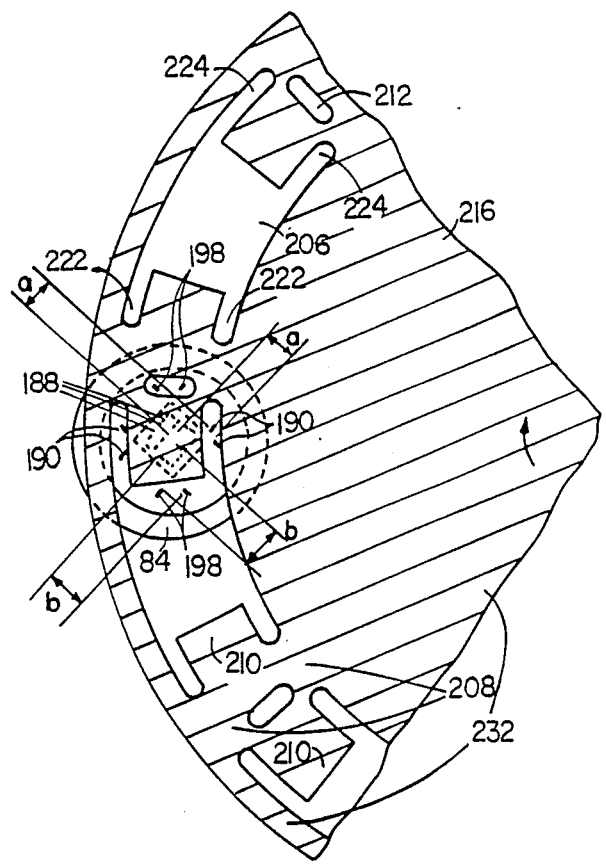
FIG. 18e shows another preferred embodiment of a shutter.

In the embodiment shown in FIG. 18e the shutter is formed with openings 206 which succeed each other in the direction of the rotary movement of the shutter and which have parallel edges extending in the direction of movement of the shutter. Adjacent openings 206 are separated by a land 208, which has a widened central portion 210. The widened portion 210 is adapted to cover the optical path which is associated with the design field 188 of the mask 84.

In accordance with FIG. 18e the widened portion 210 of the land 208 is formed with a window 212, which permits the passage of the optical path which is associated with the alignment marks 198 on the mask 84. That part of the widened portion 210 of the land 208 which is disposed between the window 212 and the opening 206 of the shutter 216 is adapted to cover the optical path which is associated with the design area 188 of the mask.

The shutter 216 shown in FIG. 18e constitutes preferred design which permits the correct relative position of the wafer and the mask to be adjusted with the aid of eight rays before the chip is exposed. A total of eight reference beamlets and eight optical paths may be used so that the desired alignment can be affected by movements in the X and Y directions, by a rotary movement and by a change of scale and distortions of the projected image can be detected. Such distortions may be due to the fact that the scales in the X and Y directions are different. Such an anamorphism may be eliminated by a proper control of ion-optical correcting elements which surround the optical path. As is apparent from FIG. 18e the structures 190 will lie within the opening 206 even when the design area 188 of the mask is covered by the widened portion 210 of the land 208 so that it will always be possible to check whether the beamlets from the marks 188 of the mask are incident on the marks 218 on the wafer (indicated in FIG. 18d), i.e., whether images of the marks 190 are actually formed by the reference beamlets on the marks 218 of the wafer. The beamlets which are associated with the marks 198 of the mask can pass through the window 212. Whereas said beamlets are interrupted by the movement of the shutter so that the aligning operation is interrupted during the exposure of the chip, that fact will not be disturbing because those reference beamlets may, for example, be used for a control of distortions, e.g., for the elimination of any anamorphism, and it is sufficient to make that correction from time to time.

Figure 18F:
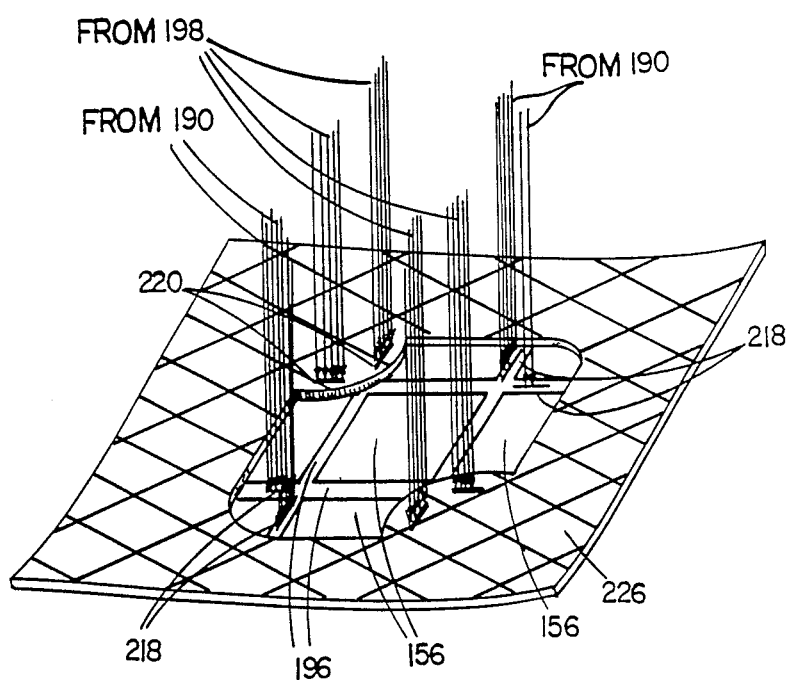
FIG. 18f is a perspective illustration of reference ion beams interacting with marks at the target station.

In accordance with FIG. 18d, all reference marks are provided on the wafer itself and may directly be associated with the marks on the wafer by eight beamlets. But such association is not essentially required. Referring to FIG. 18f, the images of the marks 198, carried by the reference beamlets, may both be formed on marks provided on the reference block 226 and other marks formed on the wafer. Alternatively, as is apparent from the discussion earlier herein, images of the mask may be formed by means of ion reference beamlets on marks which are provided only on a reference block rather than on the wafer. For this reason the reference plate may be used to define a plane with the aid of which the projected ion image can be so stably positioned in three dimensions by movements in the X and Y directions, by a rotary movement and by a change of scale that the reference to the wafer can be established from that plane. In that case it will be possible, for instance, to make exposures even when the wafer has not been provided with reference marks. For instance, if the first wafers which are exposed in the lithographic set-up through mask structures have not been provided with registration marks before, the reference beams associated with the mask structures may be caused to register with the structures on the reference block to provide a three-dimensionally stable system for the projected ion image. It will then be possible to expose the wafer in exactly positioned chip areas if the table disposed under the reference plate is properly moved and a laser interferometer, for instance, is used to check the position of the table relative to the reference plate.

Whereas the shutters shown in FIGS. 18, 18a and 18d are rotatable, they may analogously be designed as shutters for a linear movement.

Furthermore, the use of the shutter arrangements and methods of operation illustrated in FIGS. 18a, 18b and 18c is not restricted to ion-projecting systems but they may analogously be used with lithographic set-ups of optical, X-ray and electronic type.

Referring to the three dimensional cut away view in FIG. 17, a preferred embodiment of an ion projection lithography machine is provided. The main components are, in sequence, the ion source 62, solenoid 64, mask assembly 66, the optical column 68 and the target chamber 70. Ions are produced from the ion source 62, and pass through a double coil solenoid 64 that serves to analyze the beam 72, to separate the required ion specie, in this preferred embodiment helium, from other beam ion species issued from the ion source. The source includes an extractor plate 74 at a negative potential with respect to the ion source for accelerating ions produced in the source and a supressor plate 76 also at negative potential with respect to the source for applying an additional voltage for repelling electrons and thereby prohibiting their entrance to the optical column Following the extractor plate 74, an ion source X, Y alignment stage 78 is provided which allows sliding movement of the entire source for proper alignment with respect to the axis of column 68. The two coils 80, 82 of the solenoid 64 are oppositely wound to provide counter rotating magnetic excitation which acts upon the ions to prevent the beam from being rotated about its axis as a result of passage through the solenoid. The solenoid also reduces the angle at which the beam strikes the mask assembly 66; by thus reducing the solid angle of the ion beam, a greater flux may impinge upon the mask 84 and enter the column through its aperture. This reduction in angle is also important because the mask has thickness and the channels in it are very narrow; reduction in the angle of incidence minimizes the amount of shadowing that can occur due to the mask thickness. Within the first winding 80 of the solenoid an electrical shutter 86 comprised of a multipole array is provided to act as an electrical shutter to deflect the beam from the column axis using dipole fields This multipole may also apply quadrupole fields to adjust the magnification at the source beam in the X and Y directions (in the plane perpendicular to the beam axis) and thereby correct for elliptical distortions in the source.

Also provided in this region is vacuum isolation valve 144 which allows the optical column 68 to be sealed from the source during source replacement or repair. A dose monitor 128 is positioned beyond the solenoid. The outer periphery of the beam impinges upon a known area of the monitor 128 and the induced current is measured. In this way the flux of the beam through the column may be deduced and the exposure time required for a given resist determined.

Following the dose monitor 128, the beam continues on to the mask assembly 66 which is shown in FIG. 17 and most clearly illustrated in 8 larger scale view in FIG. 18. The mask assembly 66 includes a complementary set of masks 84 on a rotating disk, one of which is shown. Each mask is mounted on a flexure mount 88 which permits rotation of the die pattern in response to signals produced by linear motion of the pusher rod 90 driven by a piezo-electric transducer 92. The rotation of the mask 84 and hence rotation of the die pattern on the order of ±500 microradians is controlled in response to a beam alignment system described below. Preceeding the mask assembly 66 is exposure shutter 54 see FIG. 18, and a mask cooling cylinder 94. The cylinder 94 which extends about the beam axis and is cooled by refrigerant circulating through concentric coils 96, radiatively cools the mask. When the shutter 54 is positioned to block the beam from a mask, it simultaneously blocks the radiative cooling effects of the cyclinder 94.

Figure 17A:
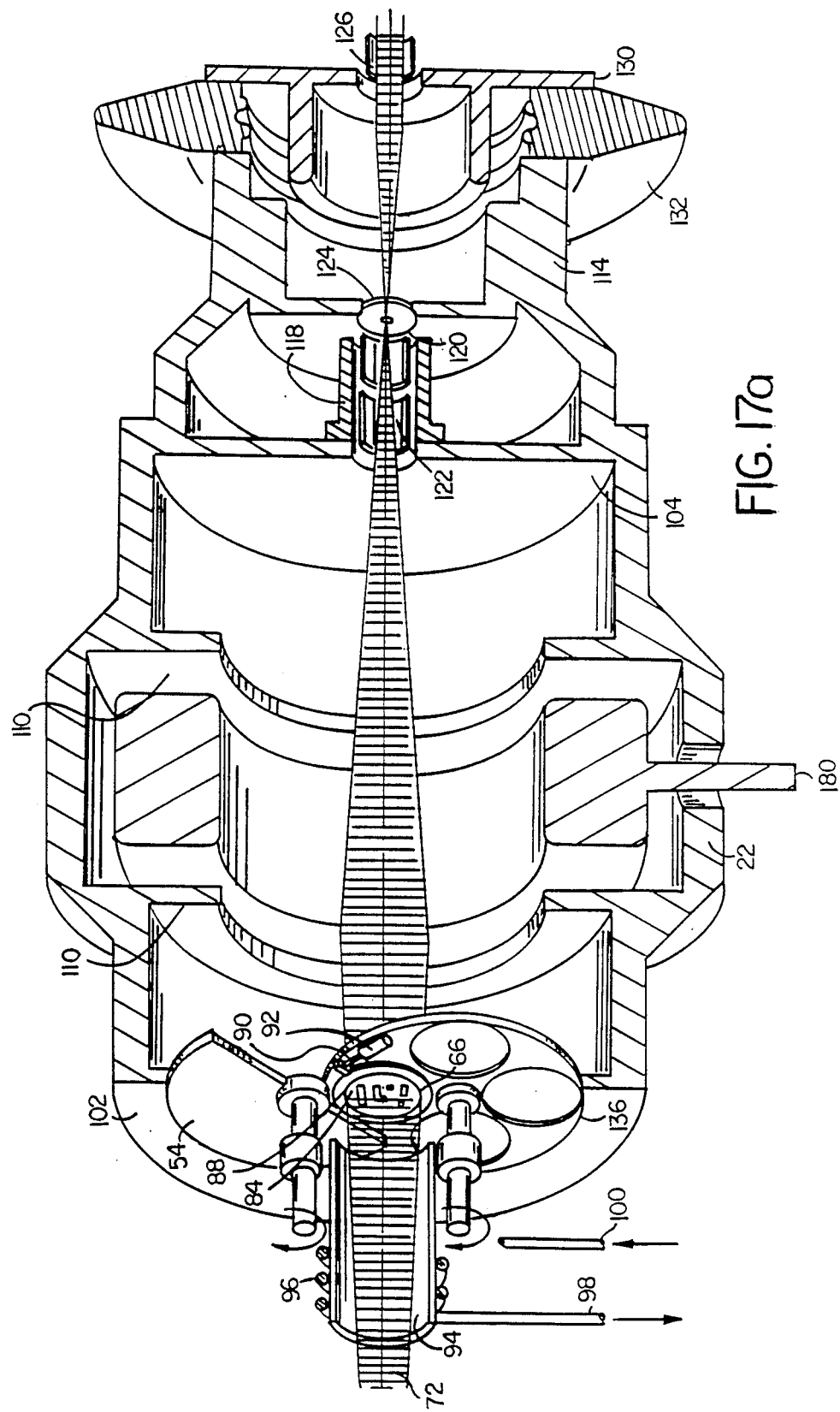
FIG. 17a is an enlarged view of the column region shown in FIG. 17.

Continuing to refer to FIGS. 17 and 17a, the beam, with its angle slightly modified by the solenoid passes through the mask 84 and enters a large diameter accelerating Einzel lens 112. The Einzel lens, as is known, is a three electrode lens. In this embodiment, the first electrode 102 and third electrode 104 are integrally formed from the column envelope, a rigid metal shell, and are at equal potential. The second, or middle electrode 106 is at a different, ion accelerating potential. A pair of field control apertures 110 are formed on either side of the middle electrode 105 to truncate its electrical field and thereby avoid distortion affects such fields are know to cause.

The beam trajectory is changed by the Einzel lens so that it converges and forms a crossover or an image of the ion source between the Einzel lens 112 and a second, gap lens 114 which in turn is used to accelerate the ions and form an image of the mask on the target 116. As is well known, a gap lens is a two electrode lens having first and second electrodes at a potential difference. In this case the first electrode 118 of gap lens 114 is an integral portion of the rigid shell and the second electrode 130 is supported by insulator bushing 132 at the end of the rigid shell. As suggested by the beam trajectory, which is shown schematically, the gap lens 114 forms beams of ions travelling substantially parallel to the axis of the column, with cross-section forming an image of the mask as it strikes the wafer. A system of this type is termed to be telecentric.

Near the position where the Einzel lens 112 forms a crossover of the ion beam, there is multipole assembly 174, preferably consisting of two successive multipoles 120, and 122 which, by application of suitable dipole fields alter the beam position in the X, Y plane (i.e., the target plane). By application of dipole fields equal in magnitude but opposite in sign to the two multipoles the beam may be offset from its original path, but remain parallel to it. The magnitude of these deflections are controlled by the beam alignment system in response to signals generated from the alignment beams and may be for example, +/− 5 microns. The multipoles are preferably an array of 16 curved arcs as shown in FIG. 17c which more closely approximate a cylindrical surface than conventional rods and may be used to generate any even powered fields (e.g. dipole, quadrupole, octupole etc.) up to a 16 pole field. In the practice of the preferred embodiment, the higher order fields are preset to correct for system distortions while the dipole fields for the deflection are superimposed.

The multipole assembly 174 is closely followed by the mass selection aperture 124 which in conjunction with the solenoid serves to select ions of only the desired mass for imaging onto the wafer. In a field free region, downstream from the aperture 124 and the gap lens 114, a multipole assembly 126 for generating quadrupole fields is provided for altering the relative magnification of the image in the X ($M_x$) and in the Y ($M_y$) direction in the wafer plane in opposition to each other. For example, if the magnification in the X-direction is made smaller, then the magnification in the y-direction is larger. This element, therefore, is used to make fine adjustments to the magnification difference between X and Y to compensate for errors such as slight tilting of the wafer in the image plane. For absolute adjustment of the magnification the main lens voltages are used as described later herein. In the embodiment in FIG. 17, the quadrupole assembly 126 is an array of 16 curved arcs as shown in FIG. 2d and is controlled by a beam alignment system in response to signals generated by back-scattered electrons at the alignment ring or wafer for making changes in the $M_x$ and $M_y$ by a factor of approximately $\pm 5 \times 10^{-4}$. It should be evident to those skilled in the art that the differential control of $M_x$ and $M_y$ using a quadrupole field following an ion projection lithography lens system, would find utility in other lens combinations besides the embodiment shown in FIG. 17.

In this embodiment, just before the beam strikes the wafer, there is located the alignment beam scanner and detector system 136 which is used to monitor the position of the image formed on the wafer and produce signals to induce correcting action of the optical elements to the extent a misalignment is detected.

Figure 17B:
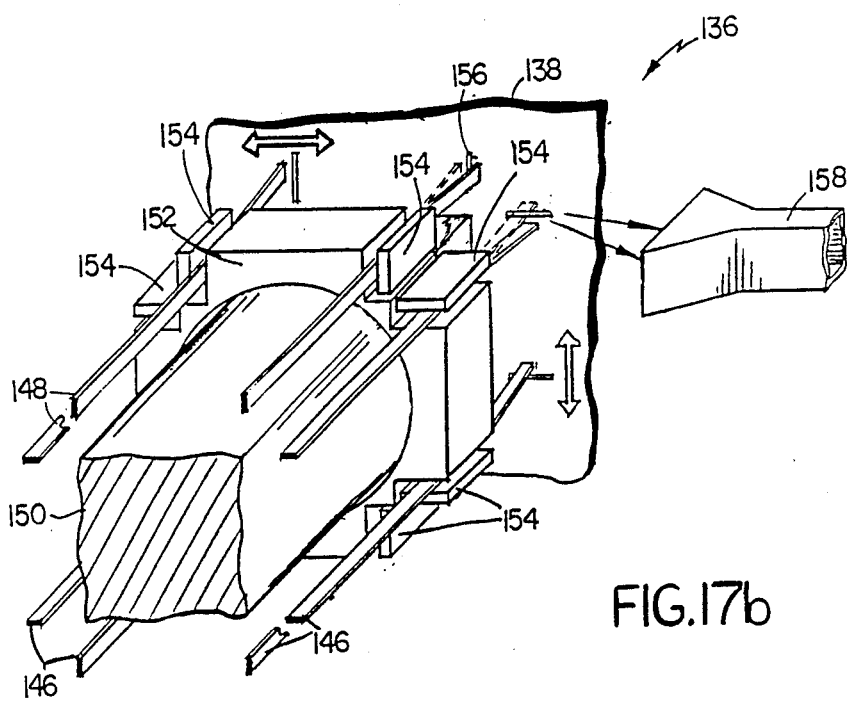
FIG. 17b is an enlarged diagrammatic view of the alignment beam scanner and detector system in FIG. 17.
Figure 17C:
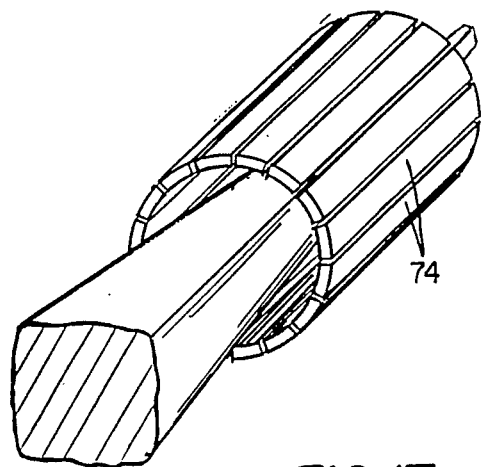
FIG. 17c is a diagrammatic perspective view illustrating the entry of the ion beam into the multipole of FIG. 17.

In FIG. 17b the design of the alignment beam scanner and detector system 136 of FIG. 17 is shown in more detail. Beamlets 148 are separated from the main die field 150 at the scanner system 136 by having the beamlets pass through the outside of a hollow isolating member or shield 152 while the die field 150 passes through its center as shown. The beamlets at this point are scanned separately from the die field by the application of dipole fields produced on the scanning plates 154. The beamlets are scanned across fiduciary marks 156 on a wafer 138. Backscattered electrons, arising from the beamlet impinging upon the marks are detected by a detector 158 which may be channeltron or an electron multiplier as previously described. Although only a single detector is illustrated, it should be understood that detectors are provided for all alignment marks. The signals from the detectors are used to locate the position of the die field 150 on the wafer 138 as described. In response to the signals, correcting fields may be applied by the ion optical elements or the rotation of the field may be adjusted by rotation of the mask 84.

Downstream from the beamlet scanners and detectors and just above the target an alignment block 2 also with fiduciary marks may be positioned as previously shown schematically in FIGS. 1, 2, or 5C.

The location of the ring relative to the wafer may be detected interferometrically and the positioning of the die field in this embodiment could be responsive to the alignment marks on the ring only. In this case, as mentioned before, die patterns could be placed on a wafer without the use of wafer alignment marks and the wafer could be simply stepped from position to position to form repetitive patterns in a so called "blind stepping" mode. By accurately determining the position of the alignment block, the alignment ring has further utility in measuring the distortion of the system with the system in a metrology mode.

Referring back to FIG. 17, the wafer 138 is mounted on a stage 40 which allows precision X, Y (in the wafer plane) and Z (along the optical axis) motion so that the wafer can be stepped from one position to another, and replicas of the image pattern can be formed at different positions on the wafer. Furthermore, the position of the wafer along the optical axis can be adjusted.

Figure 17D:
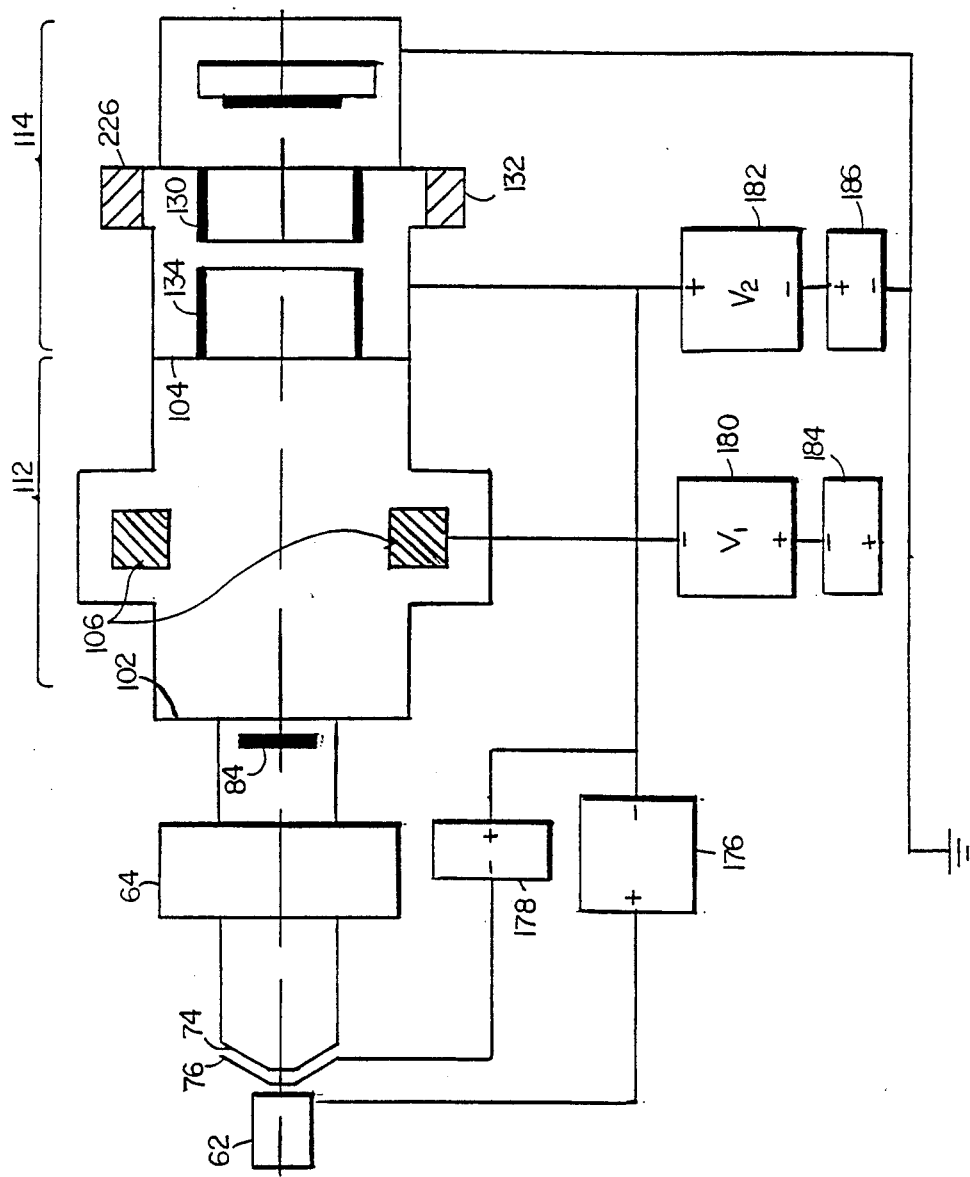
FIG. 17d is a block diagram schematic of the power supplies employed with the embodiment in FIG. 17.

In FIG. 17d a block diagram of the power supplies employed in the embodiment in FIG. 17 is shown. Source 62 is held at positive potential with respect to the extractor plate 78 by the source extraction supply 176 which can vary the accelerating potential of extracted ions from, for example, 0–10 kv. A suppressor supply 178 holds the suppressor plate 76 at a negative potential with respect to the source for the purpose of repelling electrons.

A first system supply 180 applies a negative potential to the central electrode of the Einzel lens 106 with respect to first 102 and third 104 electrodes. The net energy of the ions is therefore not affected by this lens as is a general feature of Einzel lenses. The first 102 and third 104 electrode of the Einzel lens and the first electrode of the gap lens 134 are integral components of the rigid shell of the ion column and receive a positive potential from a second power supply 182 as shown.

The potential across the gap lens is provided by connecting the negative terminal of the second power supply 182 to the second electrode 130 of the gap lens which is isolated from the column by insulator 132. The gap lens therefore accelerates the positive ions prior to their exit from the column.

The focal length of the electrostatic lenses vary as a function of the potential difference between their electrodes and therefore the magnification of an image at some position beyond the lens may be varied. In the preferred embodiment of FIG. 17, a two lens configuration, the magnification of the image at the target 116 is equal to the ratio of the focal length of the second lens over the focal length of the first lens or the ratio of the voltage ratios on each lens, namely $V_1/V_2$. By selecting the voltage ratios of the first and second lenses the gross magnification may be selected. Furthermore, if the voltage ratios applied to the lenses are increased proportionately, the focal lengths also increase in proportion but the magnification does not change. This adjustment may, however, affect the distortion of the two lenses as will be discussed below. Therefore, variation of the lens voltages provides a fine tuning means for distortion and magnification. For this fine tuning, system supplies 180 and 182 are provided with supplemental supplies 184 and 186, respectively, which are preferably under computer control and are adjusted in response to signals generated by the alignment beams for variation of the lens voltages by a few percent.

Figure 19:
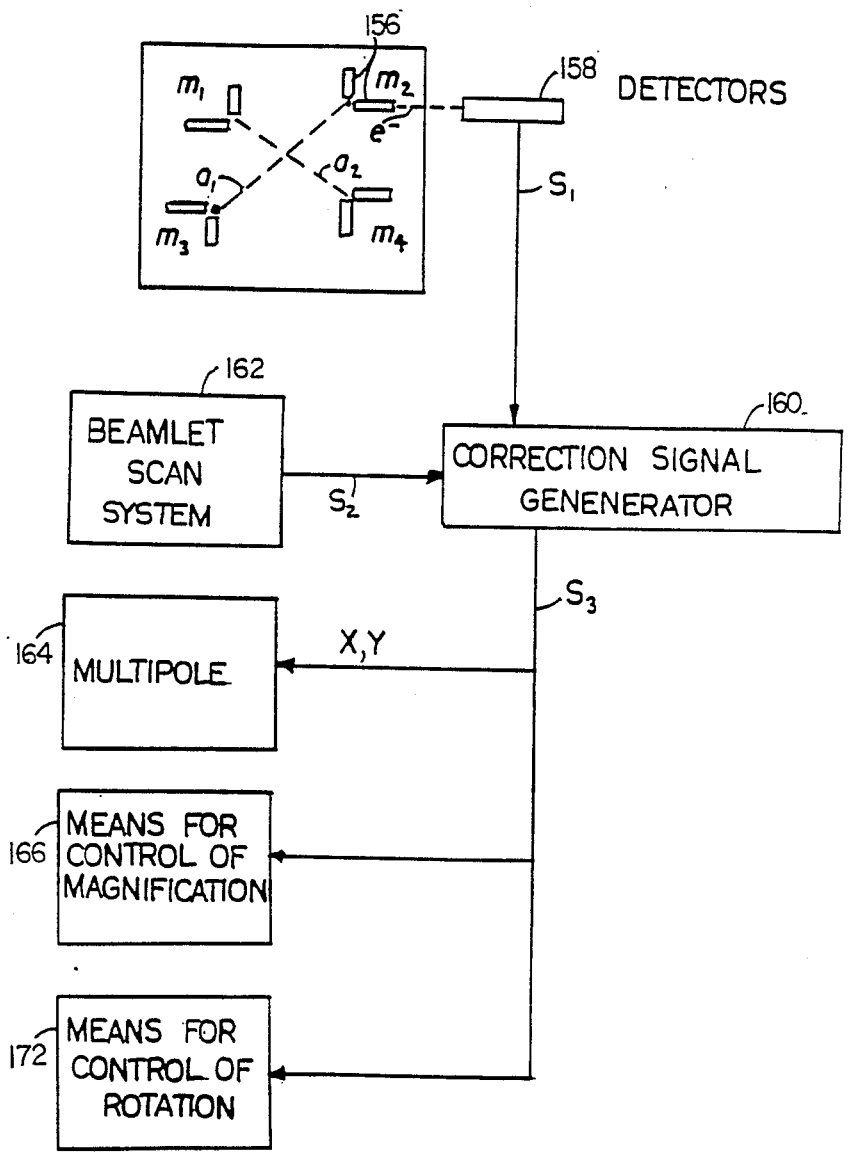
FIG. 19 is a block diagram of the alignment system employed according to the invention.

In FIG. 19 a block diagram of the alignment system is provided. Back-scattered electrons produced from alignment marks 156 which may be on the wafer and/or the reference block as mentioned above, are detected by detectors 158 positioned above the marks. In the embodiment shown in FIG. 19, four orthoganal pairs of alignment marks labeled $M_1$–$M_4$ are arranged about the region of the wafer upon which the die field is to be imaged In this preferred embodiment the distance $a_1$ between pairs $M_2$ and $M_3$ and the distance $a_2$ between pairs $M_1$ and $M_4$ are substantially nonequal.

Continuing to refer to FIG. 19, signals $S_1$ generated by the detectors are fed to a correction signal generator 160. Signal generator 160 also recieves signals $S_2$ from the beamlet scanning system 162 which are representative of the scan position of the beamlets scanned by, for example, scanning plates 154 shown in FIG. 17b. The signal generator 160 detects a deviation in the alignment of the die field by processing the signals $S_1$ and $S_2$ and generates appropriate correction signals $S_3$ which are in turn directed to the various image correction elements to apply the proper corrective action for the die field to be in proper alignment. The corrective elements may include a multipole 164 for control of x, y displacement, means 166 for correction of the magnification and the means 172 for control of rotation, e.g. for control of the mask rotation and thereby rotational alignment of the image on the wafer.

Several modifications and variations of the present invention are possible when considered in the light of the above teachings. It is therefore understood that the scope of the present invention is not to be limited to the details disclosed herein, but may be practiced otherwise than as specifically described, and is intended only to be limited by the claims appended hereto.

We claim:

1. In an ion projection lithography system, an apparatus for positioning on a substrate or wafer at a target station an ion image of structures provided on a mask, said image produced by an ion beam projected along an axis upon said mask, wherein said mask includes reference marks to provide ion reference beams about the image field, the target station includes marks and the beam of the system is controlled to establish a coincidence of the marks on the mask with the corresponding marks at said target station, said ion projection system including in its optical path an electrostatic multipole, which is adapted to be controlled by a control device, means for rotational adjustment of said image relative to said substrate, and means for correcting the scale of the image, wherein at least some of the marks at said target station are carried on a reference block, said block being disposed in a predetermined position relative to the substrate and having an aperture corresponding in size to the mask image to be formed on the substrate so that the marks on said block are disposed outside the optical path used to generate the image on the substrate, said marks being on the side of said block opposite to the side on which the wafer lies and being in position to coincide with respective reference beams while said ion image is projected along the optical path toward said target station,
   detectors provided for secondary radiation emitted by the marks on the reference block as a result of the ion reference beams passing through said marks on said mask, said detectors and reference block arranged along said beam path such that said reference block can shield said detectors from any secondary radiation emitted as a result of said beam striking a surface after passing through said aperture
   and the signals from the detectors adapted to be delivered to the control device for the multipole, the means for relative rotational adjustment of said image on said substrate and to the means for scale correction.

2. The apparatus of claim 1, wherein the reference block is provided with additional marks for use in positioning the wafer relative to the reference block,
   said wafer being associated with marks which correspond to the additional marks provided on the reference block, and optical aligning means provided for detection of deviations from a positional coincidence of said additional marks provided on the reference block and marks associated with the wafer.

3. The apparatus according to claim 2, wherein the optical means for the detection of deviations from a positional coincidence of the additional marks on the reference block and the marks associated with the wafer are coupled to a control device for moving a stage to which the wafer is secured and signals from the optical means are adapted to be delivered to the control device for moving the stage.

4. The apparatus according to claim 2, wherein the optical means for the detection of deviations from the positional coincidence of the additional marks on the reference block and marks associated with the wafer are coupled to the control device for the multipole and the means for rotatational adjustment of said image relative to said substrate.

5. The apparatus according to claim 3, wherein an interferometer is provided for detecting position changes of the stage relative to the reference block and means for adjusting the stage are adapted to be activated by the interferometer.

6. The apparatus of any of claims 1 to 5, wherein deflecting means, connected to establish a dipole electric field, are disposed in the optical path of the reference beams which are outside of the image field.

7. The apparatus of any of claims 2 to 5, wherein said ion optical system includes means to maintain a coincidence of the images of the marks on the mask and of the associated marks on the reference block during the aligning operations and optically detected deviations from a positional coincidence of the additional marks provided on the reference block with the marks associated with the wafer are compensated in that a stage on which the wafer is mounted is displaced relative to the reference block in such a manner that either the deviation from a positional coincidence of the additional marks provided on the reference block and the marks associated with the wafer is continually detected during the exposure and is converted to such a correcting movement of the stage that the deviation is decreased below a threshold value, or the positional coincidence of the additional marks provided on the reference block and the marks associated with the wafer is established by means of the aligning optical system prior to exposure.

8. The apparatus of claim 5, wherein means is provided to move a stage on which the wafer is mounted to such a position that the marks associated with the wafer deviate by less than a predetermined distance, from the desired position relative to the associated additional marks on the reference block, the interferometer is subsequently activated and is maintained in an active state at least until the exposure has been terminated, and when the interferometer has been activated the optically detected deviations from a positional coincidence of the additional marks provided on the reference block and the marks associated with the wafer are ion-optically corrected in such a manner that the ion-optical system is acted upon to correct said deviation in accordance with a predetermined relationship between the optically detected deviation and the variables which control the ion-optical system, and an exposure of the wafer is subsequently performed.

9. The apparatus of claim 8, wherein said system includes means to allow an exposure to be succeeded by at least one additional exposure for exposing one and the same wafer in at least one additional location with use of the same mask, the images of the apertures on the mask are first aligned with the marks on the reference block between two consecutive exposures and the detectors are then disabled and the ion-optical means are now corrected in dependence on the optically detected deviations of the additional marks on the reference block from the marks associated with the wafer, and another exposure is then performed.

10. The apparatus of claim 9, including means to correct the ion optical means when the system for stabilizing the images of the marks on the mask relative to the associated marks on the reference block has been disabled until the end of the exposure in dependence on the optically detected deviation of the positions of the additional marks on the reference block from the marks associated with the wafer.

11. In an ion-lithography projection system, an apparatus for controlling the positioning of an ion image of the structure of a mask on a substrate at a target station in which the mask and a surface at the target station to which the substrate is related are provided with respective marks for mutually corresponding locations, and an image of the marks of the mask is cast onto the surface at the target station and brought into coincidence with the corresponding marks thereon, said ion-lithography projection system having:
   an electrostatic multipole disposed in an ion-beam path between said mask and said substrate,
   means for rotating the image of the mask structure and
   a scale variation means disposed in the ion-beam path controllable to vary the image-reproduction scale of the image of the mask structure projected onto said substrate, the improvement which comprises:
   detectors provided for secondary radiation emitted by the marks at the target station as a result of the ion reference beams passing through said marks on said mask,
   and the signals from the detectors adapted to be delivered to a control means to control the multipole, the means for relative rotational adjustment of said image on said substrate and to the means for scale variation,
   and a shutter insertable in said path, in one position said shutter being traversable only by ions passing through said marks on said mask, and in at least one other position said shutter being traversable by ions passing through said marks on said mask and by ions forming an image of said structure, said shutter being movable across the ion path so that in the first mentioned position the target station is exposed to the ion beam only through said marks, to enable coarse alignment of said system, and in the second mentioned position of said shutter said substrate is exposed to said image of said structure simultaneously while said surface at said target station is exposed to ions passing through said marks on said mask to control alignment during exposure of said substrate,
   said control means including means operative simultaneously while exposure of the substrate to the ion image proceeds, for fine adjustment of the position of said ion image on said substrate in dependence upon said signals from said detectors whereby real time control of the position of the ion beam image on the substrate can be obtained during exposure of the substrate.

12. The apparatus of claim 11 wherein some of said marks at said target station are carried on the surface of the substrate itself.

13. The apparatus of claim 11 wherein at least some of said marks are carried on the surface of a reference block to which said substrate is positionally related.

14. The apparatus of claim 12 further comprising:
   at least two pairs of spaced-apart first detectors respectively responsive to secondary radiation emitted from said marks at said target station and operatively connected to said multipole for controlling same;
   a pair of spaced-apart second detectors responsive to secondary radiation emitted from said marks at said target station and operatively connected to said means for rotating the image of the mask structure for controlling said means; a pair of spaced apart third detectors responsive to secondary radiation emitted from said marks at said target station and operatively connected to said scale variation means so as to selectively enlarge and reduce said image of said structure on said substrate.

15. The apparatus of any of claims 1, 11, 12 or 13 wherein the means for rotating the image of the mask structure is a means for generating an axial magnetic field.

16. The apparatus of any of claims 1, 11, 12 or 13 wherein the means for rotating the image of the mask structure is a means for rotating the mask about an axis corresponding to the axis of the projection system.

17. The apparatus of any of claims 1, 11, 12 or 13 wherein the means for rotating the image of the mask structure is an auxiliary table that is rotatably mounted about the projection axis, the substrate being mounted on said auxiliary table.

18. The apparatus of claim 17, wherein an X-Y stage for supporting said substrate is mounted on said auxiliary table.

19. The apparatus of claim 17, wherein said auxiliary table carries said substrate and is mounted on an X-Y stage.

20. The apparatus of claim 1, 11, 12 or 13 wherein said means for scale variation comprises a voltage adjustment device for variation of the voltage on at least one lens of the ion projection system.

21. In a method of controlling the positioning of an ion image of the structure of a mask on a substrate in an ion-projection lithography system in which the mask and a surface at the target station positionally related to the substrate are provided with respective marks for mutually corresponding locations, and an image of the marks of the mask is cast onto said surface at the target station and brought into coincidence with the corresponding marks thereon, the improvement which comprises the step of simultaneously with exposure of said substrate to said ion beam image for reproduction of said mask structure therein, detecting said marks at said surface and bringing an image of the marks on said mask into coincidence therewith, and in dependence thereupon adjusting the position of the ion beam image to a desired position upon said substrate, thereby providing real-time control of the position of the ion beam image on the substrate during exposure of the substrate.

22. The method of claim 21 wherein at least some of said marks are carried on the surface of the substrate itself.

23. The method of claim 21 wherein at least some of said marks are carried on the surface of a reference block to which said substrate is positionally related.

24. The method of claim 21 wherein said ion-lithography projection system comprises:
   an electrostatic multipole disposed in an ion-beam path between said mask and said substrate, means for rotating the image of the mask structure, and a scale variation means disposed in the ion-beam path and controllable to vary the image-reproduction scale of the image of the mask structure projected onto said substrate, said method comprising detecting said marks on said surface at said target station with detectors provided for secondary radiation emitted by the marks as a result of the ion reference beams passing through said marks on said mask, and using the signals from the detectors to control the multipole, the means for relative rotational adjustment of said image on said substrate and the means for scale correction.

25. The method of claim 24 wherein pairs of spaced-apart first detectors respectively responsive to secondary radiation emitted from said marks on said surface are operatively connected to said multipole for controlling same;

a pair of spaced-apart second detectors responsive to secondary radiation emitted from said marks on said surface are operatively connected to said means for rotating the image of the mask structure for controlling said means and;

at least two pairs of spaced-apart third detectors are responsive to secondary radiation emitted from said marks on said surface are operatively connected to said projection lens system so as to control said scale variation means selectively to enlared and reduce said image of said structure on said substrate.

26. The method of any of the claims 21–25 in which said marks at said target station are detected by the scanning of reference beams that define the images of said marks of the mask.

27. In an ion projection lithography system for exposing a wafer to a desired image beam comprising an ion source, a mask, a shutter, a lens column and an exposure or target station, wherein the mask has, in addition to mask structure to define the desired image beam, also a set of reference marks that define reference beams adapted to be imaged by the lens column and probe corresponding reference marks at the target station for generating alignment control signals that are applied to a control means to bring the image beam into alignment with the desired position on the wafer, wherein the shutter is movable between one position in which the shutter is shaped to blank the image beam but allow a set of the reference beams to reach the target station for accomplishing relatively coarse alignment and at least one other position in which both the image beam and a set of the reference beams are allowed to simultaneously reach the target station, said control means including means operative similtaneously while the exposure of the substrate to the ion image proceeds for fine adjustment of the position of said ion beam image on said wafer in dependence upon said alignment control signals, whereby real time control of the position of the ion beam image on the wafer can be obtained during exposure of the wafer.

28. In an ion projection lithography system for exposing a wafer to a desired image beam comprising an ion source, a mask, a shutter, a lens column and an exposure or target station, wherein the mask has, in addition to mask structure to define the desired image beam, also a set of reference marks that define reference beams adapted to be imaged by the lens column and probe corresponding reference marks at the target station for generating alignment control signals that are applied to a control means to bring the image beam into alignment with the desired position on the wafer, wherein the shutter is movable to blank and unblank the image beam said shutter being constructed to allow a set of the reference beams to reach the target station simultaneously with said image beam during unblanking of the beam, said control means including means operative simultaneously while exposure of the substrate to the ion image proceeds for fine adjustment of the position of said ion beam on said wafer in dependence upon said alignment control signals whereby real time control of the position of the ion beam image on the wafer can be obtained during the exposure of the wafer.

29. The ion projection lithography system of claim 27 or 28 wherein said shutter is rotatable and includes a portion adapted to blank the image beam and inner and outer, concentric arcuate slots about said portion adapted to pass said reference beams.

30. The ion projection lithography system of claim 27 or 28 in which there are at least eight of said reference marks in an array about the image field, and said shutter is cooperatively constructed to expose at least six of said beams during exposure of said image beam to the substrate.

31. The ion projection lithography system of claim 27 or 28 wherein said image beam passes through a hollow shield while the reference beams pass outside said shield.

32. The ion projection lithography system of claim 27 or 28 including deflection means to repeatedly scan said reference beams across respective reference marks at the target station.

33. The ion projection lithography system of claim 32 wherein a separate deflection means is associated with each reference beam.

34. The system of claim 33 wherein said deflection means comprise electrostatic deflectors and wherein said image beam passes through a hollow shield while the reference beams pass outside said shield, the shield protecting the image beam from the electric fields of the deflectors.

35. The ion projection lithography system of claim 33 wherein signals derived from the probing of respectively different pairs of reference marks at said target station are employed to determine X, Y translation, rotation, and scale.

36. The ion projection lithography system of claim 35 including means in response to said signals to vary the scale in the X direction ($m_x$) relative to the scale in the Y direction ($m_y$).

37. The ion projection lithography system of claim 36 wherein said means comprises a quadrupole.

38. The ion projection lithography system of claim 33 including means to rotate the mask in response to control signals produced by said reference beams to achieve rotational alignment of the image beam with the wafer.

39. The ion projection lithography system of claim 35 wherein said lens column includes first and second lenses and said means for scale variation comprises a voltage adjustment device for disproportionate variation of the voltages on said lenses.

40. The apparatus of any of the claims 1 to 5, 11, 27 or 28 wherein means are provided whereby the reference beams are controlled by a field which can be varied with time and are thus scanned on the reference block over a region which contains the marks associated with the marks on the mask and when a mark, such as a pit, is being swept the detector generates a maximum signal, a predetermined instantaneous value of the deflecting voltage for the reference beam, which deflecting voltage changes with time, is associated with said maximum signal, this instantaneous value is compared with a desired voltage value, which corresponds to the maximum detector signal that is obtained when the image of the mask structure is stabilized so that it does not move relative to the reference block while the reference beams are sweeping over marks of the reference block, and the difference between the instantaneous value of the deflecting voltage and the desired voltage value is compensated by a control of the image-forming ion-optical system.

41. In an ion projection lithography system for exposing a wafer to a desired image beam comprising an ion source, a mask, a shutter, a lens column and an exposure or target station, wherein the mask has, in addition to mask structure to define the desired image beam, also a set of reference marks that define reference beams adapted to be imaged by the lens column and probe corresponding reference marks at the target station for generating alignment control signals that are connected to bring the image beam into alignment with the desired position on the wafer, wherein deflection means shielded from said image beam are provided to repeatedly scan said reference beam across respective reference marks at the target station.

42. A shutter for use in a lithographic system, the shutter being movable across a beam which exposes a mask, and comprising a pair of elongate openings which extend in the direction of movement of the shutter and are spaced apart transversely to that direction, each opening of said pair of openings being disposed adjacent to an optical path which is associated with an alignment mark on the mask in the manner that the alignment marks may be exposed as the shutter moves and an opening is disposed between the elongate openings of said pair over a portion of the extent of said elongate openings so that the mask can selectively be exposed in one position of the movable shutter and covered in another position of the movable shutter while the alignment mark can be exposed in both positions of the shutter.

43. The shutter of claim 42 comprising a number of pairs of said elongate openings wherein said pairs of openings succeed each other in the direction of movement of the shutter and are spaced apart in that direction.

44. A shutter according to claim 42 or 43, wherein the opening disposed between a pair of elongate openings is shorter than each of the elongate openings of the pair and that edge of the opening which is transverse to the direction of movement of the shutter, at the rear of the opening, is aligned with the end of the elongate openings.

45. A shutter according to claim 42 or 43, wherein the shutter is mounted for rotation about an axis and the pair of elongate openings consists of radially spaced apart sectors of a circular ring which are concentric to the axis of rotation of the shutter.

46. The shutter according to claim 45 wherein said opening for exposure of the mask has two arcuate edges which are concentric to the axis of rotation of the shutter.

47. A shutter for use in a lithographic system, the shutter being movable across a beam which exposes a mask, said shutter is formed with openings which succeed each other in the direction of movement of the shutter and have parallel edges extending in the direction of movement of the shutter and consecutive openings are separated from each other by a land which has a widened central portion for covering the optical path which is associated with the design area of the mask.

48. A shutter according to claim 47, wherein the widened portion of the land is formed with a window for the passage of the optical path that is associated with alignment marks on the mask.

49. A shutter according to claim 48, wherein that part of the widened portion which is disposed between the window and the opening of the shutter is adapted to cover the optical path which is associated with the design area of the mask.

* * * * *

UNITED STATES PATENT AND TRADEMARK OFFICE
CERTIFICATE OF CORRECTION

PATENT NO. : 4,967,088
DATED : October 30, 1990
INVENTOR(S) : Gerhard Stengl

It is certified that error appears in the above-identified patent and that said Letters Patent is hereby corrected as shown below:

Title page:

Other Publications, No. 2 "Politycki et al." "Demagnigying" should be --Demagnifying--.

Other Publications, No. 3 "Lithographt" should be --Lithography--.

Other Publications No. 23, "Groudrule" should be --Groundrule--.

Signed and Sealed this

Twenty-ninth Day of December, 1992

Attest:

DOUGLAS B. COMER

Attesting Officer

Acting Commissioner of Patents and Trademarks